US012677556B2

(12) United States Patent
Yohn et al.

(10) Patent No.:  US 12,677,556 B2
(45) Date of Patent:      Jul. 7, 2026

(54) DISPLAY DEVICE

(71) Applicant: LG Display Co., Ltd, Seoul (KR)

(72) Inventors: Gyujae Yohn, Gyeonggi-do (KR);
JiHun Song, Gyeonggi-do (KR)

(73) Assignee: LG Display Co., Ltd. (KR)

( * ) Notice:    Subject to any disclaimer, the term of this
patent is extended or adjusted under 35
U.S.C. 154(b) by 392 days.

(21) Appl. No.: 18/535,747

(22) Filed:     Dec. 11, 2023

(65)            Prior Publication Data

US 2024/0224668 A1      Jul. 4, 2024

(30)        Foreign Application Priority Data

Dec. 30, 2022    (KR) ........................ 10-2022-0190836

(51) Int. Cl.
H10K 59/80      (2023.01)
G09G 3/3266     (2016.01)
H10D 86/40      (2025.01)
H10D 86/60      (2025.01)
H10D 89/60      (2025.01)
H10H 29/14      (2025.01)
H10K 59/12      (2023.01)
H10K 59/124     (2023.01)
H10K 59/129     (2023.01)
H10K 59/131     (2023.01)
(52) U.S. Cl.
CPC ......... H10K 59/131 (2023.02); G09G 3/3266
(2013.01); H10D 86/441 (2025.01); **H10D
86/60 (2025.01); H10D 89/60** (2025.01);
H10H 29/142 (2025.01); H10K 59/12
(2023.02); H10K 59/124 (2023.02); **H10K
59/129 (2023.02); H10K 59/8794** (2023.02)

(58) Field of Classification Search
CPC .. H10K 59/131; H10K 59/8794; H10K 59/12;
H10K 59/124; H10K 59/129; H10D
86/60; H10D 86/441; H10D 89/60; H10H
29/142; G09G 3/3266
See application file for complete search history.

(56)                References Cited

U.S. PATENT DOCUMENTS 12,538,663  B2 *   1/2026   Kim ..................... H10K 59/122
2024/0224603  A1 *   7/2024   Kim ..................... H10K 50/846

FOREIGN PATENT DOCUMENTS

KR         20100047367  A      5/2010

* cited by examiner

*Primary Examiner* — David Vu
*Assistant Examiner* — Brandon C Fox
(74) *Attorney, Agent, or Firm* — Fish & Richardson P.C.

(57)                ABSTRACT

A display device includes a substrate having an active area
including a plurality of pixels and a non-active area sur-
rounding the active area; an inorganic insulating layer on the
substrate and extending from the active area to the non-
active area; a gate in panel (GIP) driving circuit in the
non-active area and applying a gate signal to each of the
plurality of sub pixels in the active area; a plurality of gate
link lines which transmits a gate driving signal transmitted
from the outside to the GIP driving circuit; a plurality of low
potential voltage lines which transmits a low potential
voltage to the GIP driving circuit; and at least one of first
heat transfer prevention patterns disposed in an area in
which the low potential voltage is applied from the plurality
of low potential voltage lines to the GIP driving circuit.

14 Claims, 21 Drawing Sheets

100

140
130
120
IN
110
150
160

CF(CFR,CFG,CFB)
DL(DL1,DL2,DL3,DL4)
DP(TR1,TR2,TR3,SC)

FIG. 5

DISPLAY DEVICE

CROSS-REFERENCE TO RELATED APPLICATION

This application claims the priority of Korean Patent Application No. 10-2022-0190836 filed on Dec. 30, 2022, which is incorporated herein by reference.

BACKGROUND

Field of the Disclosure

The present disclosure relates to a display device, and more particularly, to a display device which minimizes a device damage caused by heat generated during the driving.

Description of the Background

As display devices which are used for a monitor of a computer, a television, or a cellular phone, there are an organic light emitting display (OLED) device which is a self-emitting device and a liquid crystal display (LCD) device which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material to be capable of displaying images even in a folded or rolled state is getting attention as a next generation display device.

SUMMARY

Accordingly, the present disclosure is directed to a display device that substantially achieves the desires described above.

More specifically, the present disclosure is to provide a display device which uses a substrate formed of a transparent conducting oxide material or an oxide semiconductor material, instead of a plastic substrate.

The present disclosure is also to provide a display device which minimizes permeation of moisture and oxygen.

The present disclosure is also to provide a display device which removes a plastic substrate to simplify a process and reduce a manufacturing cost.

The present disclosure is also to provide a display device which blocks a heat transfer path which is generated during the driving.

The present disclosure is also to provide a display device which suppresses a device damage to improve the reliability.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a substrate having an active area including a plurality of pixels and a non-active area surrounding the active area; an inorganic insulating layer on the substrate and extending from the active area to the non-active area; a gate in panel (GIP) driving circuit in the non-active area and applying a gate signal to each of the plurality of sub pixels in the active area; a plurality of gate link lines which transmits a gate driving signal transmitted from the outside to the GIP driving circuit; a plurality of low potential voltage lines which transmits a low potential voltage to the GIP driving circuit; and at least one of first heat transfer prevention pattern disposed in an area in which the low potential voltage is applied from the plurality of low potential voltage lines to the GIP driving circuit. In addition, according to another aspect of the present disclosure, a display device includes a substrate having an active area including a plurality of sub pixels and a non-active area surrounding the active area; an inorganic insulating layer on the substrate and extending from the active area to the non-active area; a gate in panel driving circuit in the non-active area and applying a gate signal to each of the plurality of sub pixels in the active area; a plurality of wiring lines which transmits various driving signal to the gate in panel driving circuit; and at least one of heat transfer prevention pattern is disposed in at least one of an area between the gate in panel driving circuit and the plurality of wiring lines and an area between the plurality of wiring lines. Accordingly, the device damage of the thin film transistor due to a heat generated during the driving may be minimized.

Other detailed matters of the exemplary aspects are included in the detailed description and the drawings.

According to the present disclosure, a damage of a thin film transistor disposed in a GIP area is minimized to improve a device reliability of the display device.

According to the present disclosure, an inorganic layer between a wiring line disposed in a GIP area and a thin film transistor is removed to block the heat transfer path, thereby improving a driving reliability of the display device.

According to the present disclosure, a transparent conducting oxide material or an oxide semiconductor material is used as a substrate of the display device to easily control a moisture permeability.

According to the present disclosure, a thin film substrate formed of a transparent conducting oxide material, or an oxide semiconductor material is used to improve the flexibility of the display device. According to the present disclosure, a transparent conducting oxide material or an oxide semiconductor material layer is used for a substrate of a display device to relieve a stress generated when display device is bent or rolled and reduce a crack of the display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which:

FIG. 5 is a cross-sectional view taken along line V-V' of FIG. 4;

DETAILED DESCRIPTION

Figure 1:
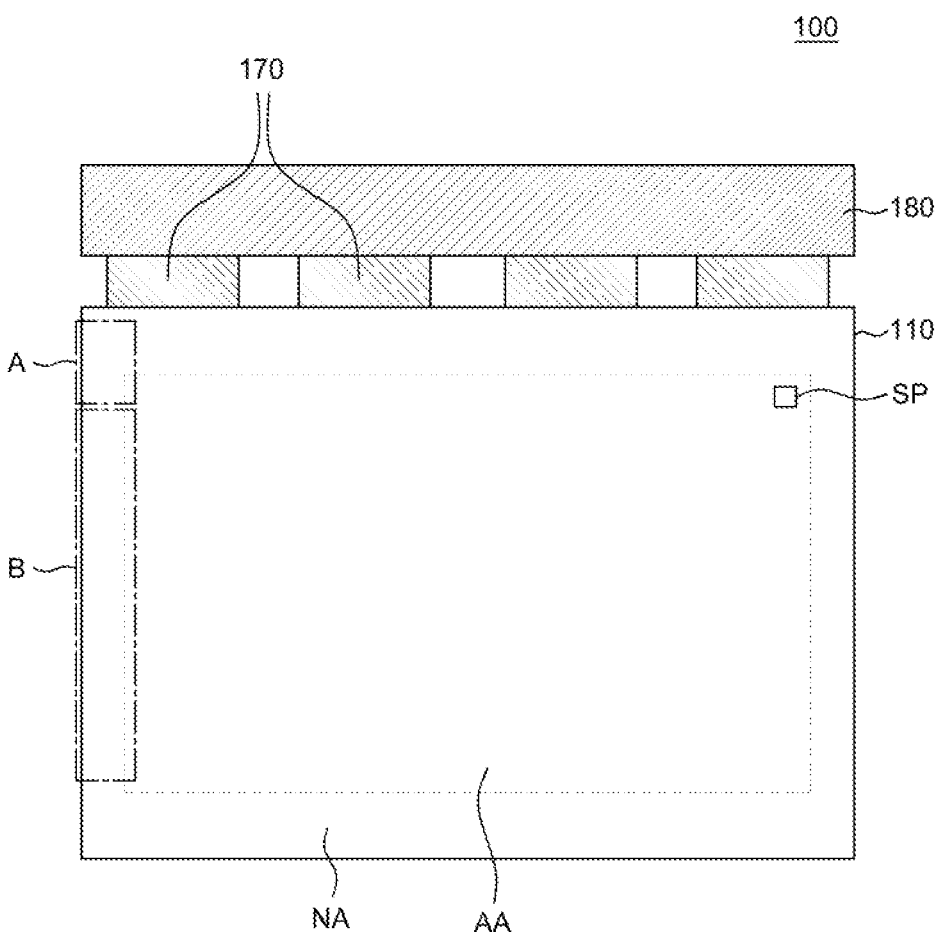
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, the present disclosure will be described in detail with reference to accompanying drawings.

Figure 2:
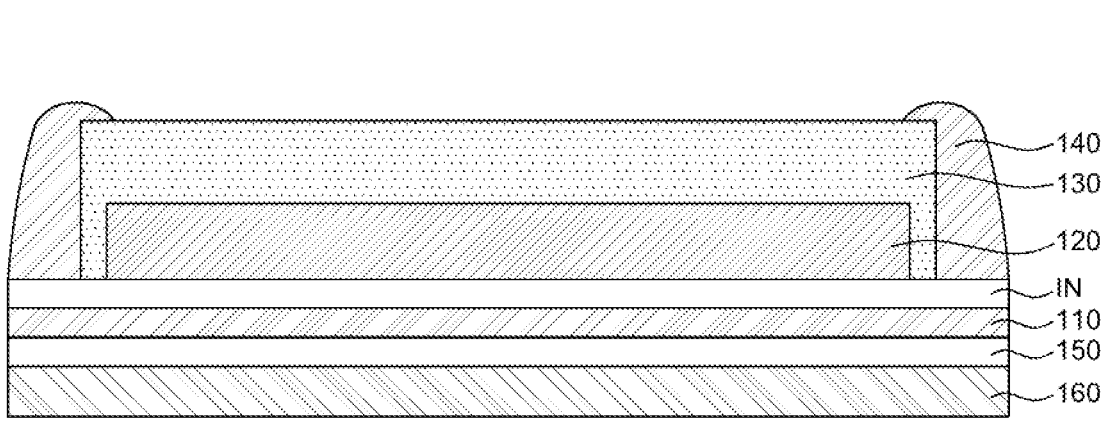
FIG. 2 is a schematic cross-sectional view of a display device according to an exemplary aspect of the present disclosure.

FIG. 1 is a plan view of a display device according to an exemplary aspect of the present disclosure. FIG. 2 is a schematic cross-sectional view of a display device according to an exemplary aspect of the present disclosure. For the convenience of description, in FIG. 1, among various components of the display device 100, only a substrate 110, a plurality of flexible films 170, and a plurality of printed circuit boards 180 are illustrated.

Referring to FIGS. 1 and 2, the substrate 110 is a support member which supports other components of the display device 100. The substrate 110 may be formed of a transparent conducting oxide material or an oxide semiconductor material.

A transparent conducting oxide material which forms the substrate 110 may be a material such as indium tin oxide (ITO), indium zinc oxide (IZO), and indium tin zinc oxide (ITZO). Further, the substrate 110 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the substrate 110 may be formed by another transparent conducting oxide or oxide semiconductor material which has not been described in the specification, but is not limited thereto.

In the meantime, the substrate 110 may be formed by depositing the transparent conducting oxide or the oxide semiconductor with a very thin thickness. Therefore, as the substrate 110 is formed to have a very thin thickness, the substrate has a flexibility. A display device 100 including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device may be rolled around the roller to be stored. Accordingly, the display device 100 according to the exemplary aspect of the present disclosure uses a substrate 110 having a flexibility to be implemented as a flexible display device 100 like a foldable display device or a rollable display device.

Further, the display device 100 according to the exemplary aspect of the present disclosure uses a substrate 110 formed of a transparent conducting oxide or an oxide semiconductor to perform a laser lift off (LLO) process. The LLO process refers to a process of separating a temporary substrate below the substrate 110 and the substrate 110 using laser during the manufacturing process of a display device 100.

The substrate 110 includes an active area AA and a non-active area NA.

The active area AA is an area where images are displayed. In the active area AA, a pixel unit 120 configured by a plurality of sub pixels SP may be disposed to display images. For example, the pixel unit 120 is configured by a plurality of sub pixels SP including an emission area in which a light emitting diode is disposed and a circuit area in which a driving circuit is disposed to display images.

The non-active area NA is an area where no image is displayed and various wiring lines and driving ICs for driving the sub pixels SP disposed in the active area AA are disposed. For example, in the non-active area NA, various driving ICs such as a gate driver IC and a data driver IC may be disposed.

The plurality of flexible films 170 is disposed at one end of the substrate 110. The plurality of flexible films 170 is electrically connected to one end of the substrate 110. The plurality of flexible films 170 is films in which various components are disposed on a base film having malleability to supply a signal to the plurality of sub pixels SP of the active area AA. One ends of the plurality of flexible films 170 are disposed in the non-active area NA of the substrate 110 to supply a data voltage to the plurality of sub pixels SP of the active area AA. In the meantime, even though it is illustrated that the plurality of flexible films 170 is four in FIG. 1, the number of flexible films 170 may vary depending on the design, but is not limited thereto.

In the meantime, a driving IC, such as a gate driver IC or a data driver IC, may be disposed on the plurality of flexible films 170. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 170 by a chip on film manner, but is not limited thereto.

The printed circuit board 180 is connected to the plurality of flexible films 170. The printed circuit board 180 is a component which supplies signals to the driving IC. Various components may be disposed in the printed circuit board 180 to supply various driving signals such as a driving signal or a data voltage to the driving IC. In the meantime, even though one printed circuit board 180 is illustrated in FIG. 1, the number of printed circuit boards 180 may vary depending on the design, but is not limited thereto.

Referring to FIG. 2, an insulating layer IN is disposed on the substrate 110. The insulating layer IN suppresses moisture and/or oxygen which penetrates from the outside of the substrate 110 from being spread. The moisture permeation characteristic of the display device 100 may be controlled by controlling a thickness or a lamination structure of the insulating layer IN. Further, the insulating layer IN may suppress a short-circuit problem caused when the substrate 110 formed of a transparent conducting oxide or an oxide semiconductor is in contact with the other configurations, such as a pixel unit 120. The insulating layer IN may be formed of an inorganic material, for example, may be configured by a single layer or a double layer of silicon oxide SiOx and silicon nitride SiNx, but is not limited thereto. The insulating layer IN may be disposed to extend to the non-active area NA.

A pixel unit 120 is disposed on the insulating layer IN. The pixel unit 120 may be disposed to correspond to the active area AA. The pixel unit 120 is a component which includes a plurality of sub pixels SP to display images. The plurality of sub pixels SP of the pixel unit 120 is minimum units which configure the active area AA and a light emitting diode and a driving circuit may be disposed in each of the plurality of sub pixels SP. For example, the light emitting diode of each of the plurality of sub pixels SP may include an organic light emitting diode including an anode, an organic emission layer, and a cathode or an LED including an N-type and a P-type semiconductor layers and an emission layer. The driving circuit for driving the plurality of sub pixels SP may include a driving element such as a thin film transistor or a storage capacitor, but is not limited thereto. Hereinafter, for the convenience of description, it is assumed that the light emitting diode of each of the plurality of sub pixels SP is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary aspect of the present disclosure is a bottom emission type display device, but it is not limited thereto.

An encapsulation layer 130 is disposed to cover the pixel unit 120. The encapsulation layer 130 seals the pixel unit 120 to protect the light emitting diode of the pixel unit 120 from moisture, oxygen, and impacts of the outside. The encapsulation layer 130 may be configured by thin film encapsulation (TFE) formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. Further, the encapsulation layer 130 may be configured by a face seal type. For example, the encapsulation layer 130 may be formed by forming an ultraviolet or thermosetting sealant on the entire surface of the pixel unit 120. However, the structure of the encapsulation layer 130 may be formed by various methods and materials, but is not limited thereto.

In the meantime, an encapsulation substrate which has a high modulus and is formed of a metal material having a strong corrosion resistance may be further disposed on the encapsulation layer 130. For example, the encapsulation substrate may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate is formed of a metal material, the encapsulation substrate may be implemented as an ultra-thin film and provide a strong resistance against external impacts and scratches.

A seal member 140 is disposed to enclose side surfaces of the pixel unit 120 and the encapsulation layer 130. The seal member 140 is disposed in the non-active area NA and is disposed to enclose the pixel unit 120 disposed in the active area AA. The seal member 140 is disposed to enclose a side surface of the pixel unit 120 and a side surface of the encapsulation layer 130 to minimize the moisture perme- ation to the pixel unit 120. For example, the seal member 140 may be disposed to cover a top surface of the insulating layer IN overlapping with the non-active area NA protruding to the outside of the pixel unit 120, a side surface of the encapsulation layer 130 disposed to enclose the pixel unit 120, and a part of a top surface of the encapsulation layer 130.

The seal member 140 may be formed of a non-conducting material having an elasticity to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly urethane, epoxy, or acryl based material, but is not limited thereto.

A film member is disposed below the substrate 110. The film member may include at least one of a polarizer 160 and a barrier film. For example, the polarizer 160 is disposed below the substrate 110. The polarizer 160 selectively trans- mits light to reduce the reflection of external light which is incident onto the substrate 110. Specifically, in the display device 100, various metal materials which are applied to semiconductor devices, wiring lines, and light emitting diodes is formed on the substrate 110. Therefore, the exter- nal light incident onto the substrate 110 may be reflected from the metal material so that the visibility of the display device 100 may be reduced due to the reflection of the external light. At this time, the polarizer 160 which sup- presses the reflection of external light is disposed below the substrate 110 to increase outdoor visibility of the display device 100. However, the polarizer 160 may be omitted depending on an implementation example of the display device 100.

In the meantime, a barrier film may be disposed below the substrate 110 together with the polarizer 160 or in a state in which the polarizer 160 is omitted. The barrier film mini- mizes the permeation of the moisture and oxygen from the outside of the substrate 110 into the substrate 110 to protect the pixel unit 120 including a light emitting diode. However, the barrier film may be omitted depending on an implemen- tation example of the display device 100, but it is not limited thereto.

An adhesive layer 150 is disposed between the film member and the substrate 110. The adhesive layer 150 is formed of a material having an adhesiveness and may be a thermosetting or natural curable type adhesive. For example, the adhesive layer 150 may be formed of an optical clear adhesive (OCA) or a pressure sensitive adhesive (PSA), but is not limited thereto.

Hereinafter, the plurality of sub pixels SP of the pixel unit 120 will be described in more detail with reference to FIGS. 3 to 5.

Figure 3:
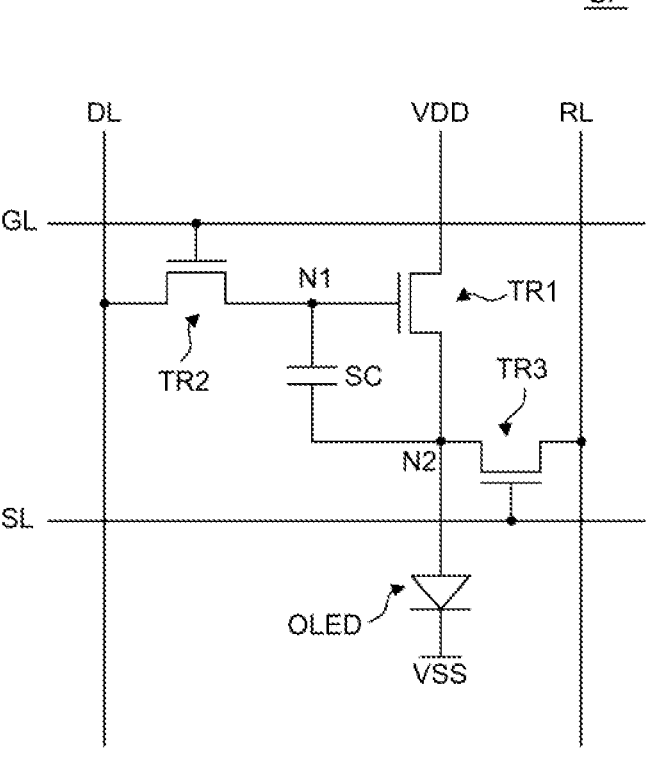
FIG. 3 is a circuit diagram of a sub pixel of a display device according to an exemplary aspect of the present disclosure.

FIG. 3 is a circuit diagram of a sub pixel of a display device according to an exemplary aspect of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. To drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source elec- trode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current flows from the drain electrode to the source electrode. Hereinafter, the descrip- tion will be made under the assumption that the first tran- sistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 is turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is con- nected to the gate line GL, the second source electrode is connected to the first node N1, and the second drain elec- trode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is con- nected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential differ- ence between the first gate electrode and the first source electrode of the first transistor TR1 while the light emitting diode OLED emits light, so that a constant driving current may be supplied to the light emitting diode OLED. The storage capacitor SC includes a plurality of capacitor elec- trodes and for example, one of a plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary aspect of the present disclosure has a 3T1C structure including three transistors and one storage capacitor SC. However, the number and a connec- tion relationship of the transistors and the storage capacitor may vary in various ways depending on the design and are not limited thereto.

Figure 4:
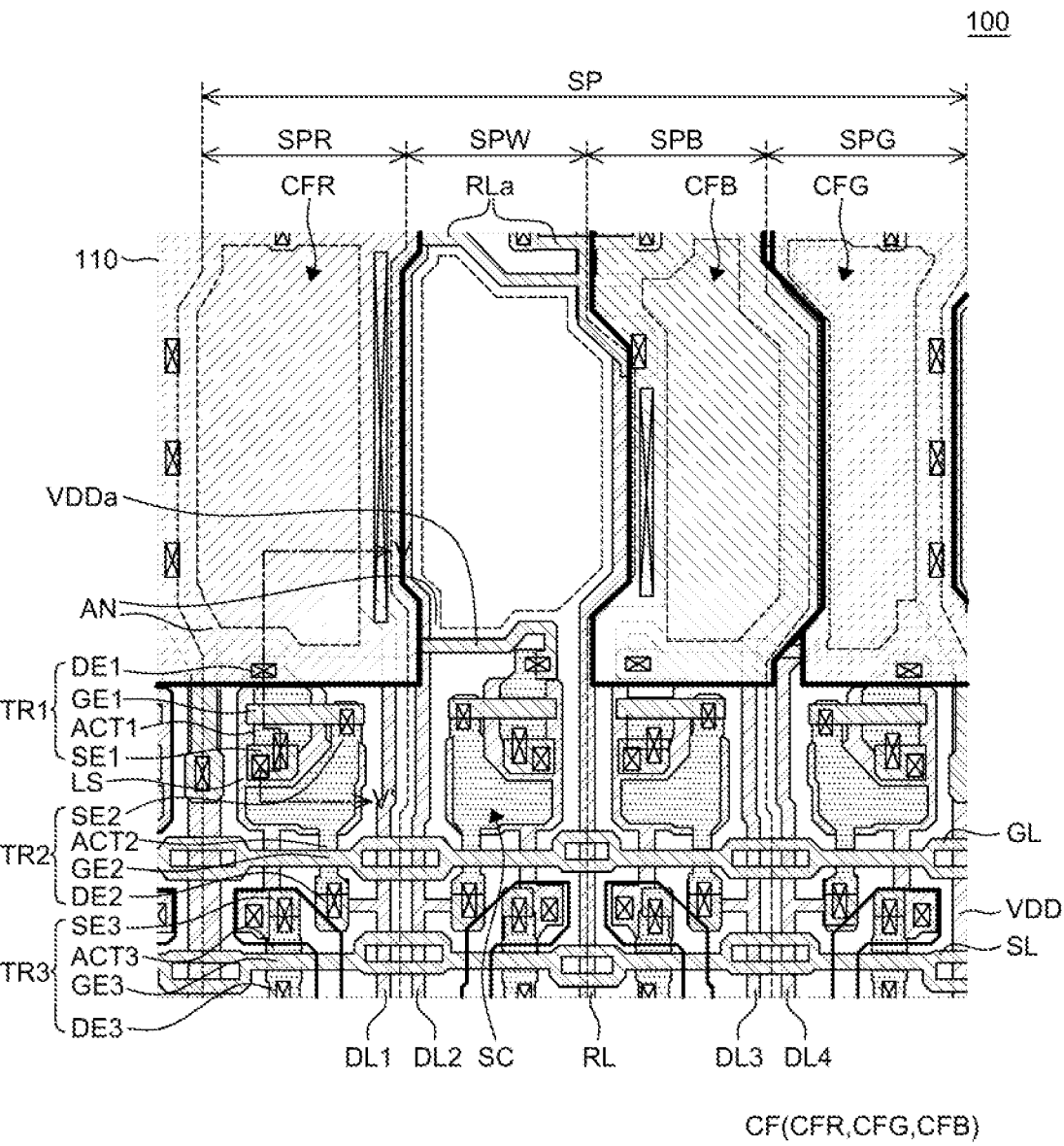
FIG. 4 is an enlarged plan view of a display device according to an exemplary aspect of the present disclosure.

FIG. 4 is an enlarged plan view of a display device according to an exemplary aspect of the present disclosure. FIG. 5 is a cross-sectional view taken along line V-V' of FIG. 4. FIG. 4 is an enlarged plan view of a red sub pixel SPR, a white sub pixel SPW, a blue sub pixel SPB, and a green sub pixel SPG which configure one pixel. In FIG. 4, for the convenience of description, the bank BNK is not illustrated and edges of the plurality of color filters CF are illustrated with a bold solid line. Referring to FIGS. 4 and 5, the display device 100 according to the exemplary aspect of the present disclosure includes a substrate 110, an insulating layer IN, a buffer layer 121, a gate insulating layer 122, a passivation layer 123, an overcoating layer 124, a bank BNK, an adhesive layer 150, a polarizer 160, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area EA and a circuit area CA. The emission area EA is an area where one color light is independently emitted and the light emitting diode OLED may be disposed therein. Spe- cifically, in an area in which the plurality of color filters CF and the anode AN overlap with each other, an area which is exposed from the bank BNK to allow light emitted from the light emitting diode OLED to travel to the outside is defined as an emission area EA. For example, referring to FIGS. 4 and 5, an emission area EA of the red sub pixel SPR is an area exposed from the bank BNK in an area in which the red color filter CFR and the anode AN overlap with each other. An emission area EA of the green sub pixel SPG is an area exposed from the bank BNK in an area in which the green color filter CFG and the anode AN overlap with each other. An emission area EA of the blue sub pixel SPB is an area exposed from the bank BNK in an area in which the blue color filter CFB and the anode AN overlap with each other. At this time, an emission area EA of the white sub pixel SPW in which a separate color filter CF is not disposed may be a white emission area which is an area overlapping with a part of the anode AN exposed from the bank BNK to emit white light.

The circuit area CA is an area excluding the emission area EA and a driving circuit DP for driving the plurality of light emitting diodes OLED and a plurality of wiring lines which transmits various signals to the driving circuit DP may be disposed therein. The circuit area CA in which the driving circuit DP, the plurality of wiring lines, and the bank BNK are disposed may be a non-emission area. For example, in the circuit area CA, the driving circuit DP including the first transistor TR1, the second transistor TR2, the third transistor TR3, and the storage capacitor SC, the plurality of high potential power lines VDD, the plurality of data lines DL, the plurality of reference lines RL, the plurality of gate lines GL, the sensing line SL, and the bank BNK are disposed. Referring to FIGS. 3 to 5 together, the adhesive layer 150 and the polarizer 160 are disposed below the substrate 110 and the insulating layer IN is disposed on the substrate 110. The plurality of high potential power line VDD, the plurality of data lines DL, the plurality of reference lines RL, and the light shielding layer LS are disposed on the insulating layer IN.

The plurality of high potential power lines VDD, the plurality of data lines DL, the plurality of reference lines RL, and the light shielding layer LS are disposed on the same layer of the substrate 110 to be formed of the same conduc- tive material. For example, the plurality of high potential power lines VDD, the plurality of data lines DL, the plurality of reference lines RL, and the light shielding layer LS may be configured by a conductive material, such as copper (Cu), aluminum (Al), molybdenum (Mo), nickel (Ni), titanium (Ti), and chrome (Cr), or an alloy thereof, but are not limited thereto.

The plurality of high potential power lines VDD is wiring lines which transmit the high potential power signal to each of the plurality of sub pixels SP. The plurality of high potential power lines VDD extends between the plurality of sub pixels SP in a column direction and two sub pixels SP which are adjacent to each other in the row direction may share one high potential power line VDD among the plu- rality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Figure 5:
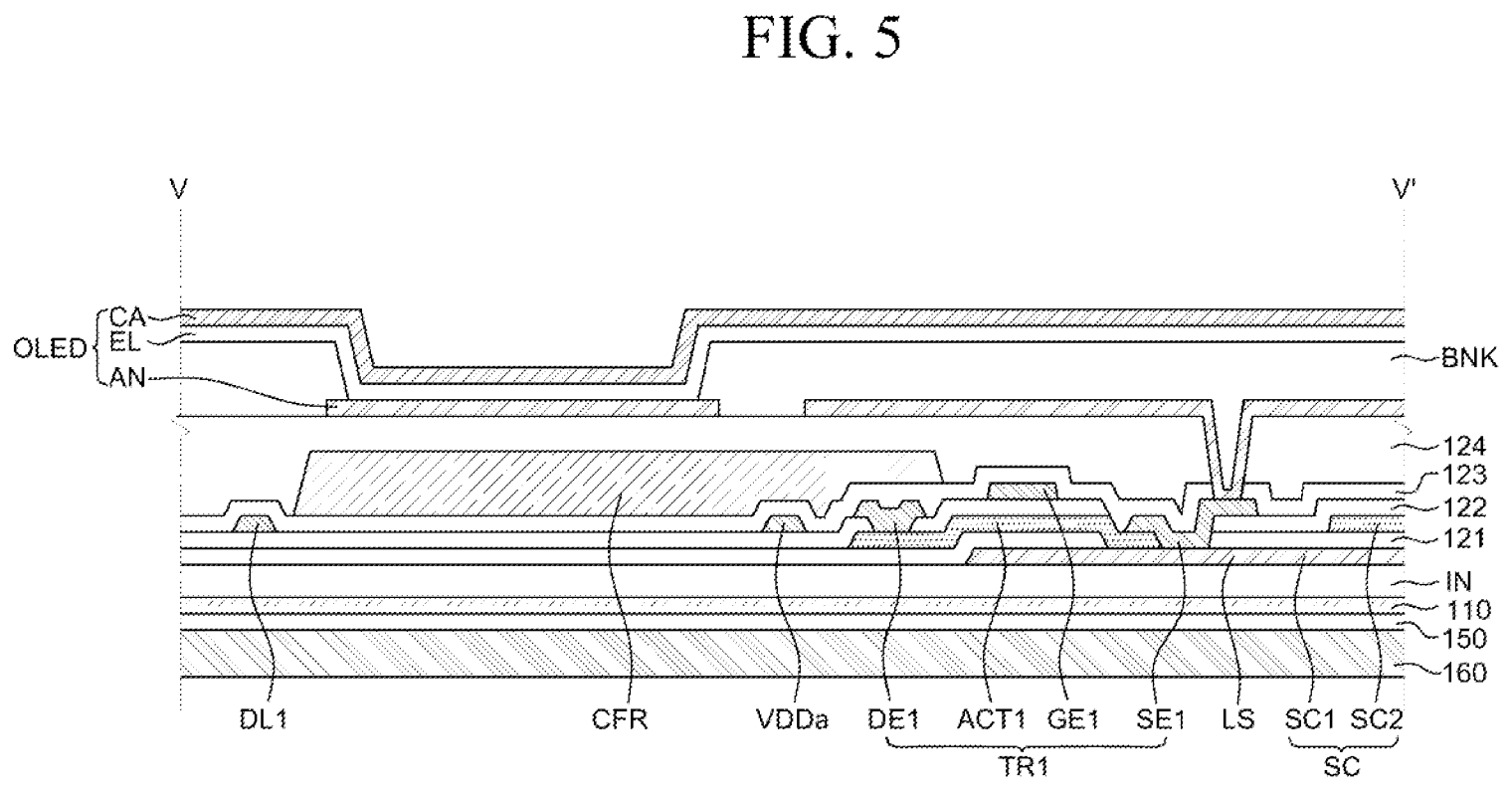

Referring to FIGS. 4 and 5 together, the light shielding layer LS is disposed on the insulating layer IN. The light shielding layer LS is disposed to overlap with the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material, such as copper (Cu), aluminum (Al), molybdenum (Mo), nickel (Ni), titanium (Ti), and chrome (Cr), or an alloy thereof, is disposed to overlap with the first active layer ACT1, light incident from the lower portion of the substrate 110 onto the first active layer ACT may be blocked. Accordingly, the reliability of the first transistor TR1 may be improved. However, it is not limited thereto and the light shielding layer LS may be disposed to overlap with the second active layer ACT2 of the second transistor TR2 and the third active layer ACT3 of the third transistor TR3.

In the meantime, even though in the drawing, it is illustrated that the light shielding layer LS is a single layer, the light shielding layer LS may be formed as a plurality of layers. For example, the light shielding layer LS may be formed of a plurality of layers disposed to overlap with each other with at least one of the insulating layer IN, the buffer layer 121, the gate insulating layer 122, and the passivation layer 123 therebetween.

The buffer layer 121 is disposed on the plurality of high potential power lines VDD, the plurality of data lines DL, the plurality of reference lines RL, and the light shielding layer LS. The buffer layer 121 may reduce permeation of moisture or impurities through the substrate 110. For example, the buffer layer 121 may be configured by a single layer or a double layer of silicon oxide SiOx or silicon nitride SiNx, but is not limited thereto. Further, the buffer layer 121 may be omitted depending on a type of substrate 110 or a type of transistor, but is not limited thereto. The buffer layer 121 may be disposed to extend to the non-active area NA.

In each of the plurality of sub pixels SP, the first transistor TR1, the second transistor TR2, the third transistor TR3, and the storage capacitor SC are disposed on the buffer layer 121.

First, the first transistor TR1 includes a first active layer ACT1, a first gate electrode GE1, a first source electrode SE1, and a first drain electrode DE1.

The first active layer ACT1 is disposed on the buffer layer 121. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 122 is disposed on the first active layer ACT1. The gate insulating layer 122 is a layer for electrically insulating the first gate electrode GE1 from the first active layer ACT1 and may be formed of an insulating material. For example, the gate insulating layer 122 may be configured by a single layer or a double layer of silicon oxide SiOx or silicon nitride SiNx, but is not limited thereto. The gate insulating layer 122 may be disposed to extend to the non-active area NA.

The first gate electrode GE1 is disposed on the gate insulating layer 122 to overlap with the first active layer ACT1. The first gate electrode GE1 may be configured by a conductive material, such as copper (Cu), aluminum (Al), molybdenum (Mo), nickel (Ni), titanium (Ti), and chrome (Cr), or an alloy thereof, but is not limited thereto.

A first source electrode SE1 and a first drain electrode DE1 which are spaced apart from each other are disposed on the gate insulating layer 122. The first source electrode SE1 and the first drain electrode DE1 may be electrically connected to the first active layer ACT1 through a contact hole formed on the gate insulating layer 122. The first source electrode SE1 and the first drain electrode DE1 may be disposed on the same layer as the first gate electrode GE1 to be formed of the same conductive material, but are not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 122 and the buffer layer 121. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through contact holes formed in the gate insulating layer 122 and the buffer layer 121. Further, a part of the first active layer ACT1 connected to the first source electrode SE1 may be electrically connected to the light shielding layer LS through a contact hole formed in the buffer layer 121. If the light shielding layer LS is floated, a threshold voltage of the first transistor TR1 fluctuates to affect the driving of the display device 100. Accordingly, the light shielding layer LS is electrically connected to the first source electrode SE1 to apply a voltage to the light shielding layer LS and it does not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 may be in direct contact with the light shielding layer LS. However, it is not limited thereto.

In the meantime, even though in FIG. 5, it is illustrated that the gate insulating layer 122 is formed on the entire substrate 110, the gate insulating layer 122 may be patterned to overlap with only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the buffer layer 121. The second active layer ACT2 may be formed of a semiconductor material, such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the buffer layer 121. The second source electrode SE2 may be integrally formed with the second active layer ACT2 to be electrically connected to each other. For example, the semiconductor material is formed on the buffer layer 121 and a part of the semiconductor material is conducted to form the second source electrode SE2. Therefore, a part of the semiconductor material which is not conducted may become a second active layer ACT2 and a conducted part serves as a second source electrode SE2. However, the second active layer ACT2 and the second source electrode SE2 may be separately formed, but are not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 122. Accordingly, the first transistor TR1 may be turned on or turned off by a signal from the second transistor TR2.

The gate insulating layer 122 is disposed on the second active layer ACT2 and the second source electrode SE2 and the second drain electrode DE2 and the second gate electrode GE2 are disposed on the gate insulating layer 122.

The second gate electrode GE2 is disposed on the gate insulating layer 122 to overlap with the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material, such as copper (Cu), aluminum (Al), molybdenum (Mo), nickel (Ni), titanium (Ti), chrome (Cr), or an alloy thereof, but is not limited thereto.

In the meantime, the second gate electrode GE2 extends from the gate line GL. That is, the second gate electrode GE2 is integrally formed with the gate line GL and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 122. The second drain electrode DE2 is electrically connected to the second active layer ACT2 through a contact hole formed in the gate insulating layer 122 and is electrically connected to one of the plurality of data lines DL through a contact hole formed in the gate insulating layer 122 and the buffer layer 121, simultaneously. For example, the second drain electrode DE2 of the red sub pixel SPR is electrically connected to the first data line DL1 and the second drain electrode DE2 of the white sub pixel SPW is electrically connected to the second data line DL2. For example, the second drain electrode DE2 of the blue sub pixel SPB is electrically connected to the third data line DL3 and the second drain electrode DE2 of the green sub pixel SPG is electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the buffer layer 121. The third active layer ACT3 may be formed of a semiconductor material, such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 122 is disposed on the third active layer ACT3 and the third gate electrode GE3, the third source electrode SE3, and the third drain electrode DE3 are disposed on the gate insulating layer 122.

The third gate electrode GE3 is disposed on the gate insulating layer 122 to overlap with the third active layer ACT3. The third gate electrode GE3 is electrically connected to the sensing line SL and the third transistor TR3 may be turned on or turned off based on the sensing voltage transmitted to the third transistor TR3. The third gate electrode GE3 may be configured by a conductive material, such as copper (Cu), aluminum (Al), molybdenum (Mo), nickel (Ni), titanium (Ti), chrome (Cr), or an alloy thereof, but is not limited thereto.

In the meantime, the third gate electrode GE3 extends from the sensing line SL. That is, the third gate electrode GE3 is integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 122. The third source electrode SE3 may be configured by a conductive material, such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the buffer layer 121. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 122. The third drain electrode DE3 may be configured by a conductive material, such as copper (Cu), aluminum (Al), molybdenum (Mo), nickel (Ni), titanium (Ti), chrome (Cr), or an alloy thereof, but is not limited thereto.

The third drain electrode DE3 is electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line RLa extends in the row direction to electrically connect the reference line RL and the third drain electrode DE3 of each of the plurality of sub pixels SP. One end of the auxiliary reference line RLa is electrically connected to the reference line RL through a contact hole formed in the buffer layer 121 and the gate insulating layer 122. The other end of the auxiliary reference line RLa is electrically connected to the third drain electrode DE3 of each of the plurality of sub pixels SP. In this case, the auxiliary reference line RLa is integrally formed with the third drain electrode DE3 of each of the plurality of sub pixels SP and a reference voltage from the reference line RL is transmitted to the third drain electrode DE3 by means of the auxiliary reference line RLa. However, the auxiliary reference line RLa may be separately formed from the third drain electrode DE3, but is not limited thereto.

The storage capacitor SC is disposed in the circuit area CA of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

First, in each of the plurality of sub pixels SP, the first capacitor electrode SC1 is disposed between the insulating layer IN and the buffer layer 121. The first capacitor electrode SC1 may be disposed to be the closest to the substrate 110 among the conductive components disposed on the substrate 110. The first capacitor electrode SC1 is integrally formed with the light shielding layer LS and is electrically connected to the first source electrode SE1 by means of the light shielding layer LS.

The buffer layer 121 is disposed on the first capacitor electrode SC1 and the second capacitor electrode SC2 is disposed on the buffer layer 121. The second capacitor electrode SC2 may be disposed to overlap with the first capacitor electrode SC1. The second capacitor electrode SC2 is integrally formed with the second source electrode SE2 to be electrically connected to the second source electrode SE2 and the first gate electrode GE1. For example, the semiconductor material is formed on the buffer layer 121 and a part of the semiconductor material is conducted to form the second source electrode SE2 and the second capacitor electrode SC2. Accordingly, a part of the semiconductor material which is not conducted functions as a second active layer ACT2 and the conducted part functions as a second source electrode SE2 and the second capacitor electrode SC2. As described above, the first gate electrode GE1 is electrically connected to the second source electrode SE2 through the contact hole formed in the gate insulating layer 122. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the second active layer ACT2 to be electrically connected to the second source electrode SE2 and the first gate electrode GE1. Accordingly, the first capacitor electrode SC1 and the second capacitor electrode SC2 which overlap with the buffer layer 121 therebetween constantly maintain the voltage of the first gate electrode GE1 and the first source electrode SE1 of the first transistor TR1 to maintain the constant state of the light emitting diode OLED.

The passivation layer 123 is disposed on the first transistor TR1, the second transistor TR2, the third transistor TR3, and the storage capacitor SC. The passivation layer 123 is an insulating layer for protecting components below the passivation layer 123. For example, the passivation layer 123 may be configured by a single layer or a double layer of silicon oxide SiOx or silicon nitride SiNx, but is not limited thereto. Further, the passivation layer 123 may be omitted depending on the exemplary aspect. The passivation layer 123 may be disposed to extend to the non-active area NA.

A plurality of color filters CF may be disposed in the emission area EA of each of the plurality of sub pixels SP on the passivation layer 123. As described above, the display device 100 according to the exemplary aspect of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and is implemented as various colors of light.

The plurality of color filters CF may include a red color filter CFR, a blue color filter CFB, and a green color filter CFG. The red color filter CFR is disposed in an emission area of a red sub pixel SPR of the plurality of sub pixels SP, the blue color filter CFB is disposed in an emission area of the blue sub pixel SPB, and the green color filter CFG is disposed in an emission area of the green sub pixel SPG.

The overcoating layer 124 is disposed on the passivation layer 123 and the plurality of color filters CF. The overcoating layer 124 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The overcoating layer 124 may be formed of an organic material, and for example, may be configured by a single layer or a double layer of polyimide or photo acryl, but is not limited thereto. The overcoating layer 124 may be disposed to extend to the non-active area NA.

The light emitting diode OLED is disposed in an emission rea of each of the plurality of sub pixels SP. The light emitting diode OLED is disposed on the overcoating layer 124 in each of the plurality of sub pixels SP. The light emitting diode OLED includes an anode AN, an emission layer EL, and a cathode CA.

The anode AN is disposed on the overcoating layer 124 in the emission area EA. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN extends toward the circuit area CA. A part of the anode AN extends toward the first source electrode SE1 of the circuit area CA from the emission area EA and is electrically connected to the first source electrode SE1 through a contact hole formed in the overcoating layer 124 and the passivation layer 123. Accordingly, the anode AN of the light emitting diode OLED extends to the circuit area CA to be electrically connected to the first source electrode SE1 of the first transistor TR1 and the second capacitor electrode SC2 of the storage capacitor SC.

In the emission area EA and the circuit area CA, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer, such as a hole injection layer, a hole transport layer, an electron transport layer, and an electron injection layer.

In the emission area EA and the circuit area CA, the cathode CA is disposed on the emission layer EL. The cathode CA supplies electrons to the emission layer EL so that the cathode may be formed of a conductive material having a low work function. The cathode CA may be formed as one layer over the plurality of sub pixels SP. That is, the cathodes CA of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5, the cathode CA of the light emitting diode OLED is electrically connected to the low potential power line VSS to be supplied with a low potential power voltage.

The bank BNK is disposed between the anode AN and the emission layer EL. The bank BNK is disposed to overlap with the active area AA and cover the edge of the anode AN. The bank BNK is disposed at the boundary between the sub pixels SP which are adjacent to each other to reduce the color mixture of light emitted from the light emitting diode OLED of each of the plurality of sub pixels SP. The bank BNK may be formed of an insulating material, such as polyimide, acryl, or benzocyclobutene (BCB) resin, but it is not limited thereto.

As described above, the substrate 110 of the display device 100 according to the exemplary aspect of the present disclosure is formed of the transparent conducting material or the oxide semiconductor material and is formed as a thin film with a small thickness. Therefore, the flexibility thereof may be improved more than the existing substrate formed of glass or plastic material.

However, since the substrate 110 of the display device 100 is formed to be too thin, the heat generated during the driving is not smoothly dissipated, which may cause a problem. To be more specific, when a heat is generated under the driving condition in which the same voltage is applied, a threshold voltage Vth of the active layer is negatively shifted and thus the characteristic of the transistor is degraded. Further, when the heat is more severe, a burnt that the transistor blows out may occur.

For example, when the active layer is formed of oxide semiconductor, such as indium gallium zinc oxide (IGZO), if the heat is generated to increase the temperature, an oxygen vacancy Vo of the oxide semiconductor is increased and the bond of the oxide semiconductor is broken to generate oxygen. A carrier density in the active layer is increased by the oxygen generated as described above and the threshold voltage Vth is negatively shifted. Further, when the carrier density is increased as described above, a high current degradation (HCD) effect occurs so that there is a problem in that a break-down voltage margin of the transistor is reduced. Therefore, a device characteristic of the transistor is degraded and when the heat generation is more severe, there may be a problem in that the transistor blows out.

For example, when the active layer is formed of polysilicon, to increase the carrier density, generally a dopant is injected into the active layer. At this time, when the temperature increases by the generated heat, the dopant is excessively activated by the heat energy so that there is a problem in that the carrier density is excessively increased. As described above, when the carrier density is excessively increased, the threshold voltage Vth of the active layer is negatively shifted. Further, when the carrier density is increased, the HCD effect occurs so that there is a problem in that a break down voltage margin of the transistor is reduced. Therefore, a device characteristic of the transistor is degraded and when the heat generation is more severe, there may be a problem in that the transistor blows out.

Therefore, according to the display device 100 according to the exemplary aspect of the present disclosure, when the display device 100 according to the exemplary aspect of the present disclosure is driven, even though the heat is generated, a heat transfer path is blocked to minimize the damage of the transistor.

Figure 6:
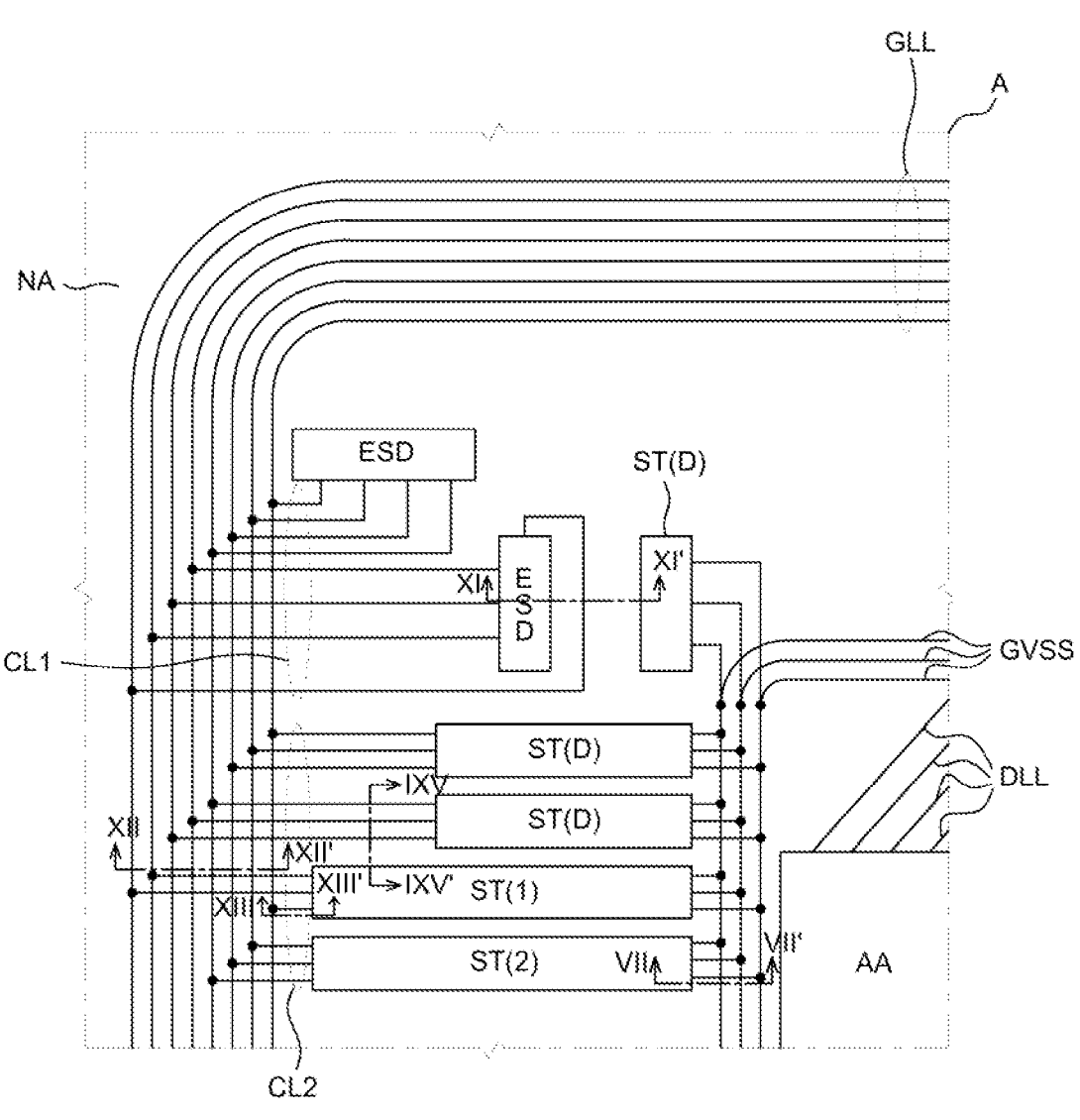
FIG. 6 is an enlarged plan view of area A of FIG. 1.
Figure 7:
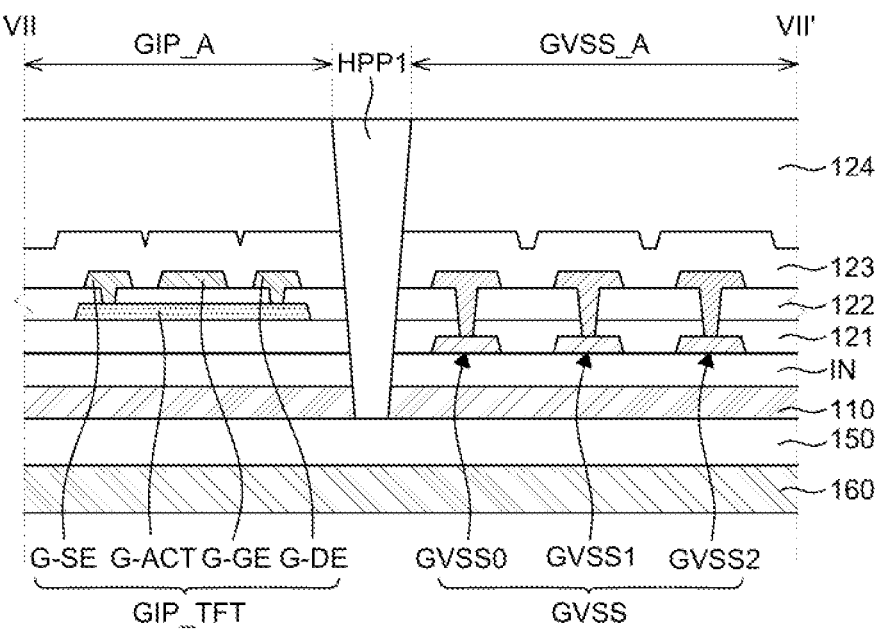
FIG. 7 is a cross-sectional view of a first exemplary aspect taken along line VII-VII' of FIG. 6.
Figure 8A:
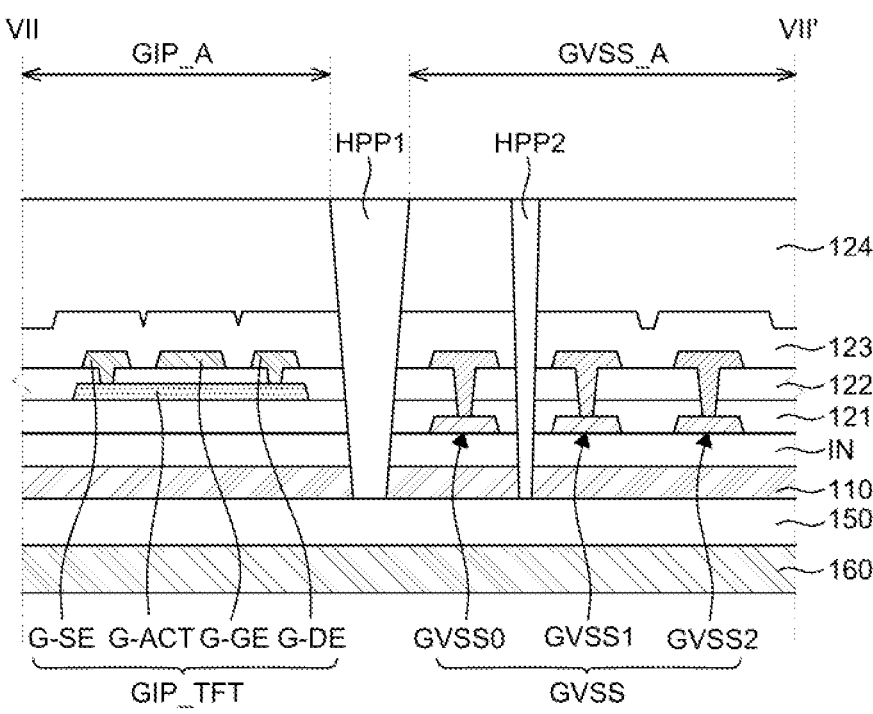
FIGS. 8A to 8C are cross-sectional views of a second exemplary aspect taken along line VII-VII' of FIG. 6.
Figure 8B:
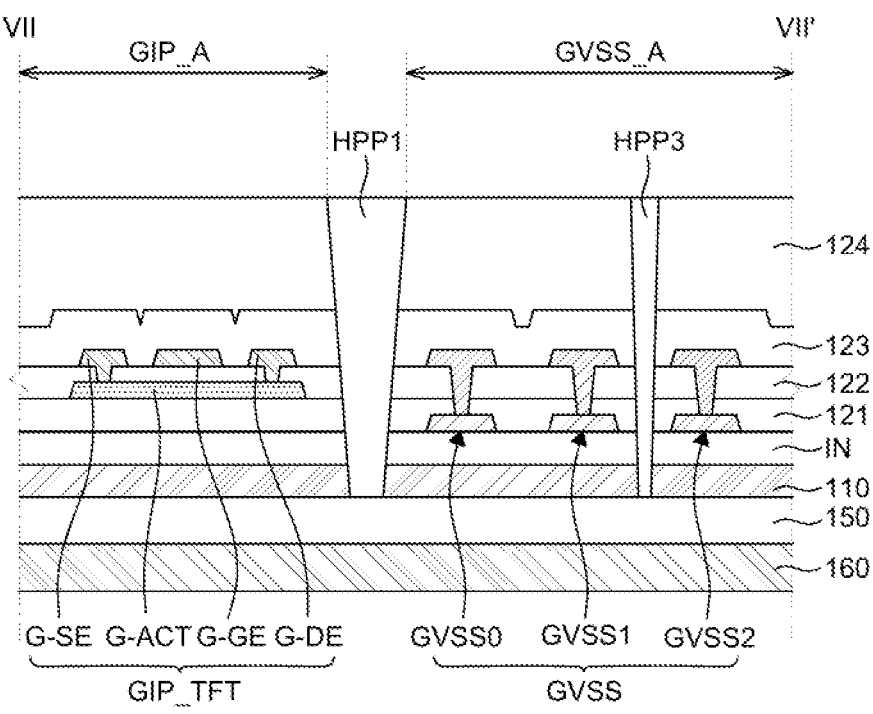
Figure 8C:
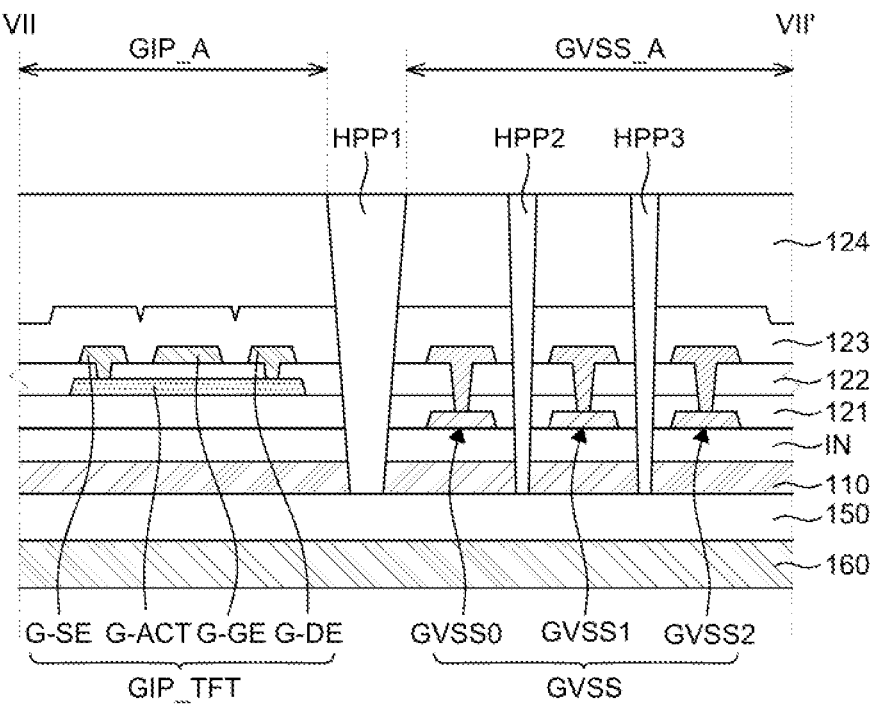
Figure 9:
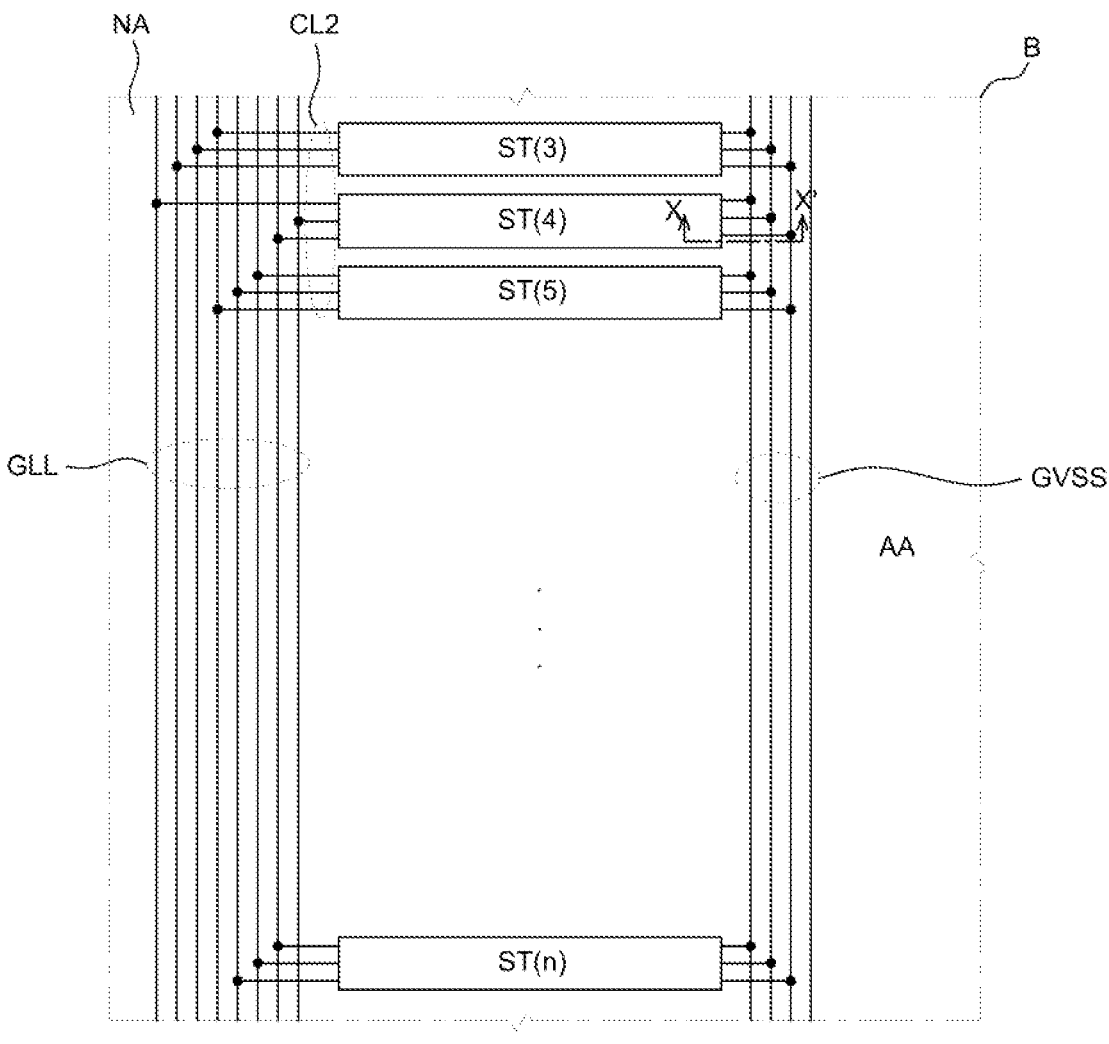
FIG. 9 is an enlarged plan view of area B of FIG. 1.
Figure 11A:
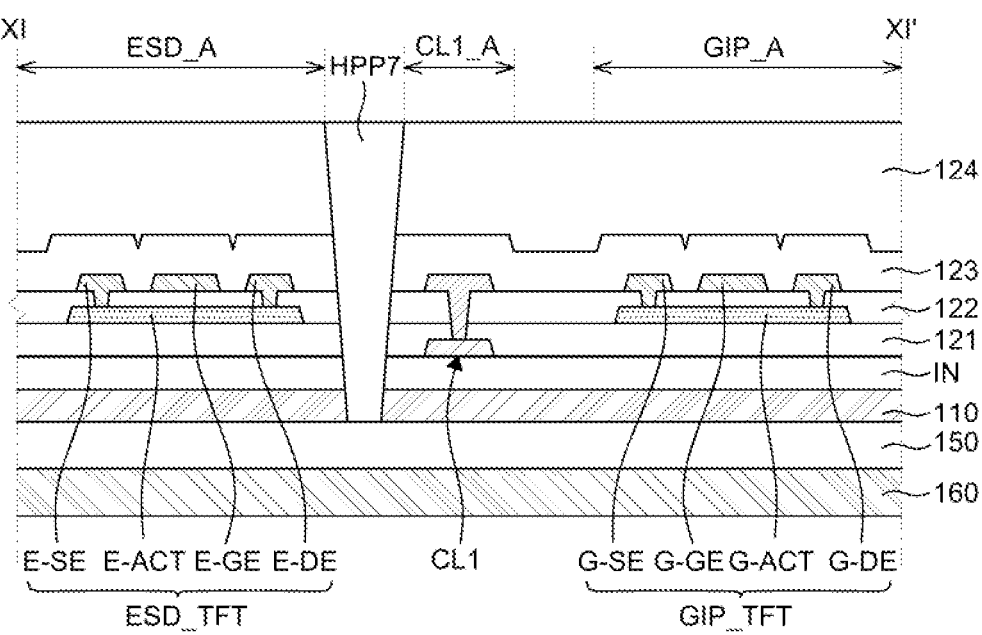
FIGS. 11A to 11C are cross-sectional views of exemplary aspects taken along line XI-XI' of FIG. 6.
Figure 11B:
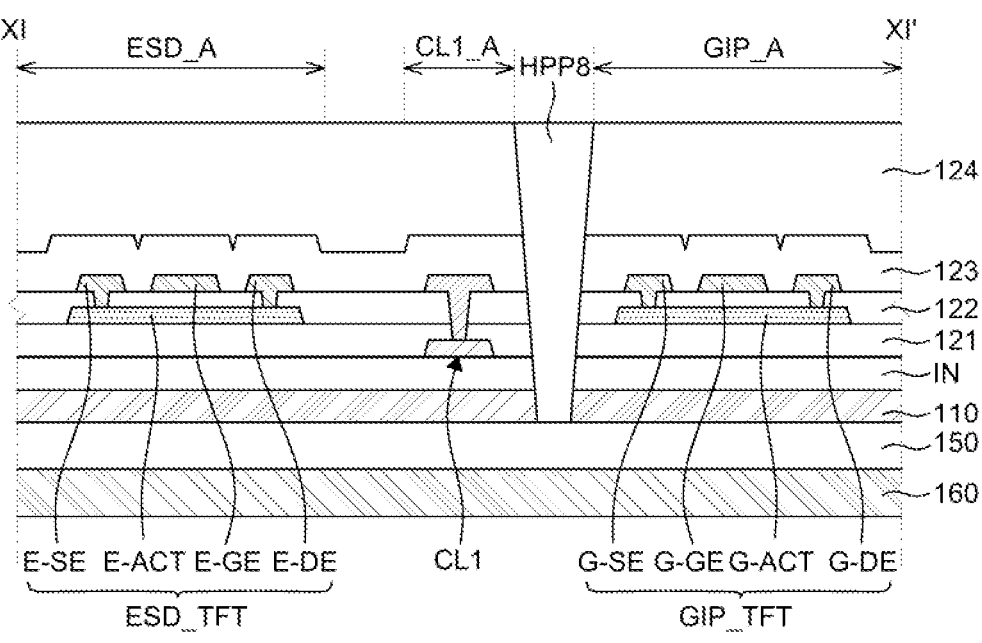
Figure 11C:
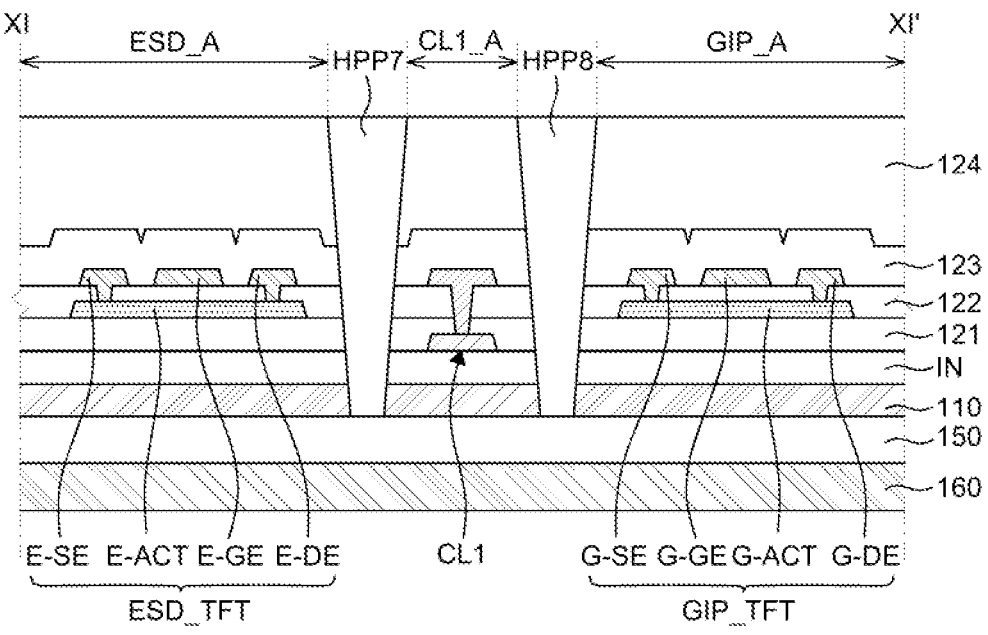
Figure 12:
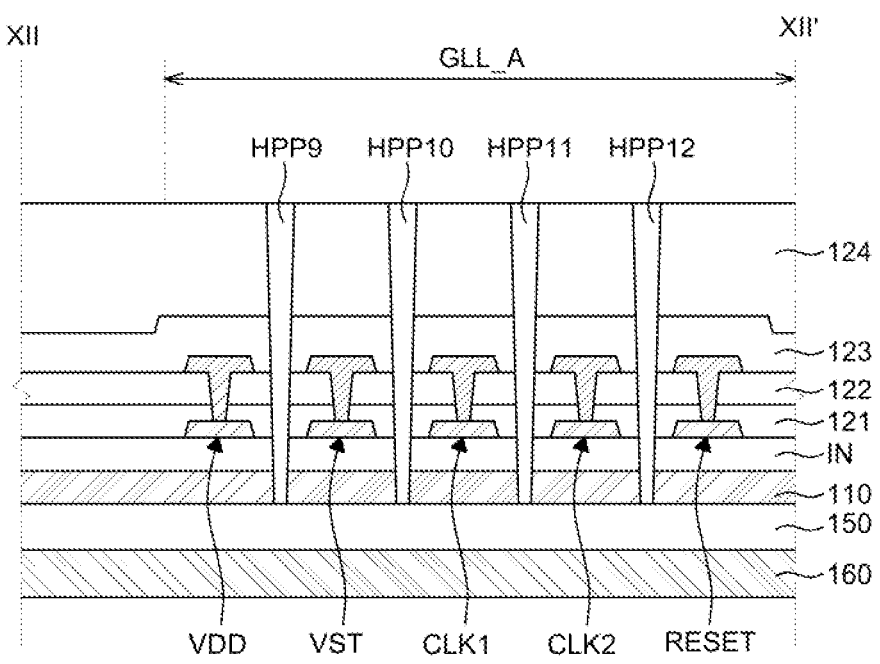
FIG. 12 is a cross-sectional view taken along line XII-XII' of FIG. 6.
Figure 13:
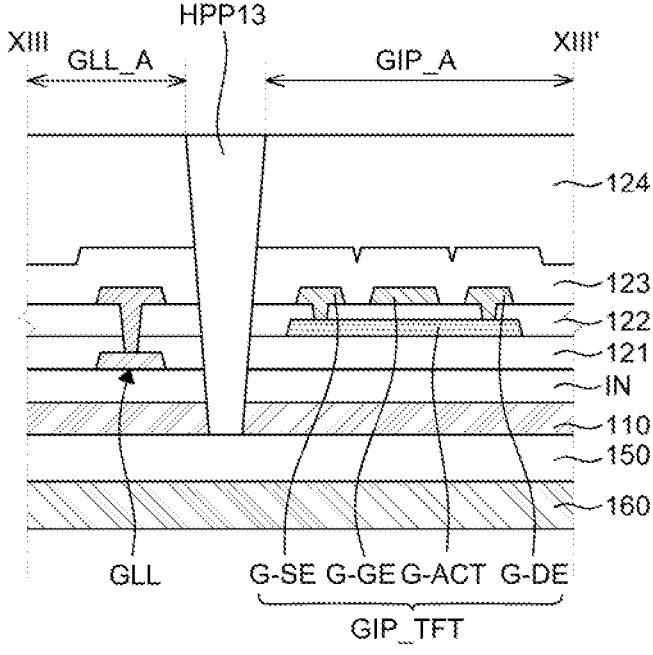
FIG. 13 is a cross-sectional view taken along line XIII-XIII' of FIG. 6.
Figure 14:
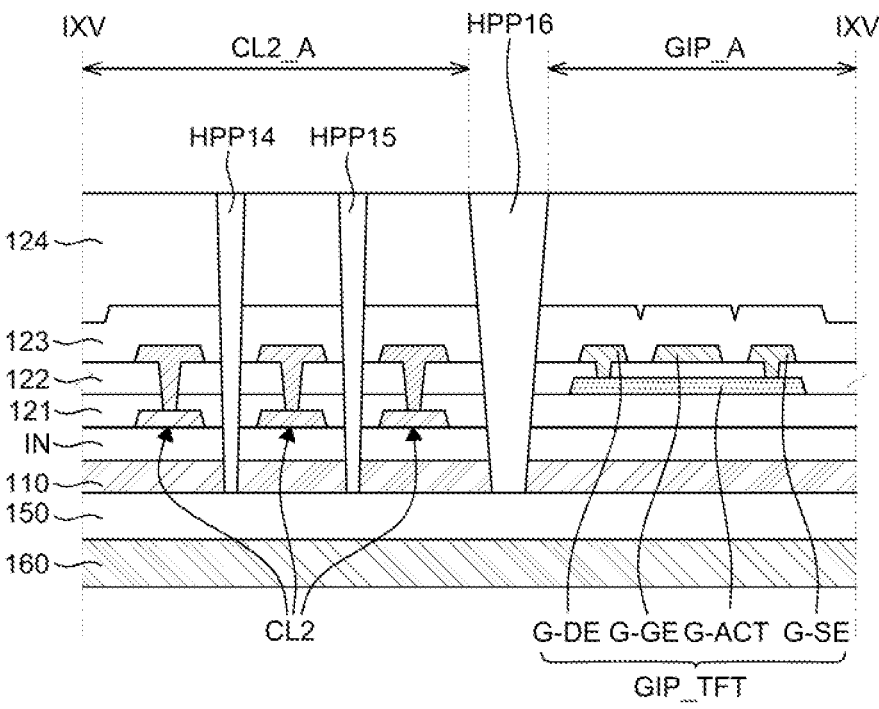
FIG. 14 is a cross-sectional view taken along line IXV-IXV' of FIG. 6.

FIG. 6 is an enlarged plan view of an area A of FIG. 1. FIG. 7 is a cross-sectional view of a first exemplary aspect taken along line VII-VII' of FIG. 6. FIGS. 8A to 8C are cross-sectional views of a second exemplary aspect taken along line VII-VII' of FIG. 6. FIG. 9 is an enlarged plan view of an area B of FIG. 1. FIGS. 10A to 10D are cross-sectional views of exemplary aspects taken along line X-X' of FIG. 9. FIGS. 11A to 11C are cross-sectional views of exemplary aspects taken along line XI-XI' of FIG. 6. FIG. 12 is a cross-sectional view taken along line XII-XII' of FIG. 6. FIG. 13 is a cross-sectional view taken along line XIII-XIII' of FIG. 6. FIG. 14 is a cross-sectional view taken along line IXV-IXV' of FIG. 6.

Further, referring to FIG. 6, in the non-active area NA, a gate in panel type gate driving circuit (hereinafter, referred to as a "GIP driving circuit"), an electro static discharge circuit (hereinafter, referred to as an "ESD circuit"), a plurality of data link lines DLL, a plurality of gate link lines GLL, a plurality of gate low potential voltage lines GVSS, a plurality of first connection lines CL1, and a plurality of second connection lines CL2 are disposed.

The GIP driving circuit is configured by a plurality of stages ST(D), ST(1), ST(2), . . . . The GIP driving circuit may be configured as a gate in panel type by transistors formed in the non-active area NA during a process of forming a transistor of the active area AA. The GIP driving circuit generates a gate signal corresponding to a gate driving signal input through the gate link line GLL to sequentially supply the gate signal to the gate line of the active area AA. The GIP driving circuit is configured by a plurality of stages.

The ESD circuit ESD is a circuit which discharges an overcurrent or static electricity which are generated in the plurality of gate link lines GLL, the plurality of first connection lines CL1, and the plurality of second connection lines CL2 to be input to the GIP driving circuit. The ESD circuit ESD may be configured by a transistor for discharging static electricity.

The plurality of data link lines DLL may electrically connect the data driving circuit and the data line disposed in the active area AA. The plurality of data link lines DLL transmits a data driving signal input from the outside to the data line of the active area AA.

The plurality of gate link lines GLL electrically connects external signals input through a gate pad unit (not illustrated) to the GIP driving circuit. The plurality of gate link lines GLL transmits a gate driving signal input from the outside to the gate line of the active area AA. The gate link line GLL includes a gate start signal line VST, a plurality of clock signal lines CLK1, CLK2, . . . , a reset signal line RESET, and a high potential voltage line VDD.

The plurality of gate low potential voltage lines GVSS is signal lines which supply a low potential voltage to each stage which configures the GIP driving circuit.

The plurality of first connection lines CL1 electrically connects the gate link line GLL and the electrostatic discharge circuit.

The plurality of second connection lines CL2 electrically connects the gate link line GLL and each stage of the GIP driving circuit.

In the meantime, in FIG. 6, a number of wiring lines and a circuit configuration are illustrative and the number of wiring lines and the circuit configuration are not limited thereto.

In the non-active area NA of the display device 100 configured as described above, as described above, the heat generated during the driving is transferred due to the substrate 110 having so small thickness to damage the transistor which configures the GIP driving circuit and the ESD circuit ESD. Therefore, the heat transfer prevention pattern which suppresses the damage of the transistor may be disposed.

Referring to FIG. 7, a first heat transfer prevention pattern HPP1 is disposed between a GIP driving circuit area GIP_A in which the GIP driving circuit is disposed and a gate low potential voltage line area GVSS_A in which a plurality of gate low potential voltage lines GVSS0, GVSS1, and GVSS2 is disposed. To be more specific, the first heat transfer prevention pattern HPP1 may be disposed between a GIP transistor GIP_TFT which forms the GIP driving circuit and includes a source electrode G-SE, a drain electrode G-DE, a gate electrode G-GE, and an active layer G-ACT and a first gate low potential voltage line GVSS0. Referring to FIG. 6 again, the first heat transfer prevention pattern HPP1 is disposed between a stage ST(2) which forms the GIP driving circuit and a first gate low potential voltage line GVSS0.

The first heat transfer prevention pattern HPP1 is formed by etching the substrate 110, the insulating layer IN, the buffer layer 121, the gate insulating layer 122, and the passivation layer 123 (hereinafter, these layers may be referred to as inorganic insulating layers IN, 121, 122, and 123) between the GIP transistor GIP_TFT and the first gate low potential voltage line GVSS0 to remove the substrate 110 and the inorganic insulating layers IN, 121, 122, and 123 to block the heat transfer path, and then filling an organic material having a thermal conductivity lower than that of an inorganic material, such as polyimide and urethane material, in holes of the substrate 110 and the inorganic insulating layers IN, 121, 122, and 123 which are areas obtained by removing the substrate 110 and the inorganic insulating layers IN, 121, 122, and 123. For example, the first heat transfer prevention pattern HPP1 may be formed separately from the overcoating layer 124 or simultaneously formed with the overcoating layer 124 to be integrally formed with the overcoating layer 124. However, the present disclosure is not limited thereto and the first heat transfer prevention pattern HPP1 may be formed may be formed by filling the air in the holes of the substrate 110 and the inorganic insulating layers IN, 121, 122, and 123.

As described above, in the display device 100 according to the exemplary aspect of the present disclosure, one first heat transfer prevention pattern HPP1 is disposed between the GIP driving circuit area GIP_A and the gate low potential voltage line area GVSS_A. By doing this, the damage of the GIP transistor GIP_TFT which forms the GIP driving circuit is minimized.

In the meantime, in FIG. 7, a first exemplary aspect that one first heat transfer prevention pattern HPP1 is disposed between the GIP driving circuit area GIP_A and the gate low potential voltage line area GVSS_A has been described, but it is not limited thereto and two or more heat transfer prevention patterns may also be disposed.

Referring to FIG. 8A, the first heat transfer prevention pattern HPP1 is disposed between the GIP transistor GIP_TFT which forms the GIP driving circuit and the first gate low potential voltage line GVSS0. A second heat transfer prevention pattern HPP2 is disposed between the first gate low potential voltage line GVSS0 and the second gate low potential voltage line GVSS1. The second heat transfer prevention pattern HPP2 is also formed by removing the substrate 110 and the inorganic insulating layers IN, 121, 122, and 123 disposed on the first gate low potential voltage line GVSS0 and the second gate low potential voltage line GVSS1 and then filling the organic material therein. The second heat transfer prevention pattern HPP2 may also be formed separately from the overcoating layer 124 or simultaneously formed with the overcoating layer 124 to be integrally formed with the overcoating layer 124 or formed to be filled with air.

Referring to FIG. 8B, the first heat transfer prevention pattern HPP1 is disposed between the GIP transistor GIP_TFT which forms the GIP driving circuit and the first gate low potential voltage line GVSS0. A third heat transfer prevention pattern HPP3 is disposed between the second gate low potential voltage line GVSS1 and the third gate low potential voltage line GVSS2. The third heat transfer prevention pattern HPP3 is also formed by removing the substrate 110 and the inorganic insulating layers IN, 121, 122, and 123 disposed on the second gate low potential voltage line GVSS1 and the third gate low potential voltage line GVSS2 and then filling the organic material therein. The third heat transfer prevention pattern HPP3 may also be formed separately from the overcoating layer 124 or simultaneously formed with the overcoating layer 124 to be integrally formed with the overcoating layer 124 or formed to be filled with air.

Referring to FIG. 8C, the first heat transfer prevention pattern HPP1 is disposed between the GIP transistor GIP_TFT which forms the GIP driving circuit and the first gate low potential voltage line GVSS0. A second heat transfer prevention pattern HPP2 is disposed between the first gate low potential voltage line GVSS0 and the second gate low potential voltage line GVSS1. A third heat transfer prevention pattern HPP3 is disposed between the second gate low potential voltage line GVSS1 and the third gate low potential voltage line GVSS2. That is, the first heat transfer prevention pattern HPP1 is disposed between the GIP driving circuit area GIP_A and an area GVSS_A in which the gate low potential voltage lines GVSS are disposed. The second heat transfer prevention pattern HPP2 and the third heat transfer prevention pattern HPP3 are also disposed between the gate low potential voltage lines GVSS.

As described above, in the display device 100 according to the exemplary aspect of the present disclosure, the heat transfer prevention pattern HPP1 is disposed between the GIP driving circuit area GIP_A and the area GVSS_A in which the gate low potential voltage lines GVSS are disposed. Further, one or more heat transfer prevention patterns HPP2 and HPP3 are disposed between the gate low potential voltage lines GVSS. By doing this, the transistor is protected from the heat generated during the driving to improve the reliability of the display device 100.

In the meantime, it has been described that in the non-active area NA of the display device 100, one or more heat transfer prevention patterns are disposed in the area A of FIG. 1 to which a signal is applied. However, the present disclosure is not limited thereto and the heat transfer prevention pattern is also disposed in an area B in which the signal applied in the area A is received.

Referring to FIG. 9, in the non-active area NA of the display device 100, a plurality of stages ST(3), ST(4), ST(5), . . . , ST(n) which forms the GIP driving circuits is disposed. Further, as illustrated in FIGS. 10A to 10D, one or more heat transfer prevention patterns may be disposed between the GIP transistor GIP_TFT which forms the plurality of stages ST(3), ST(4), ST(5), . . . , ST(n) and the gate low potential voltage lines GVSS and between the gate low potential voltage lines GVSS.

Figure 10A:
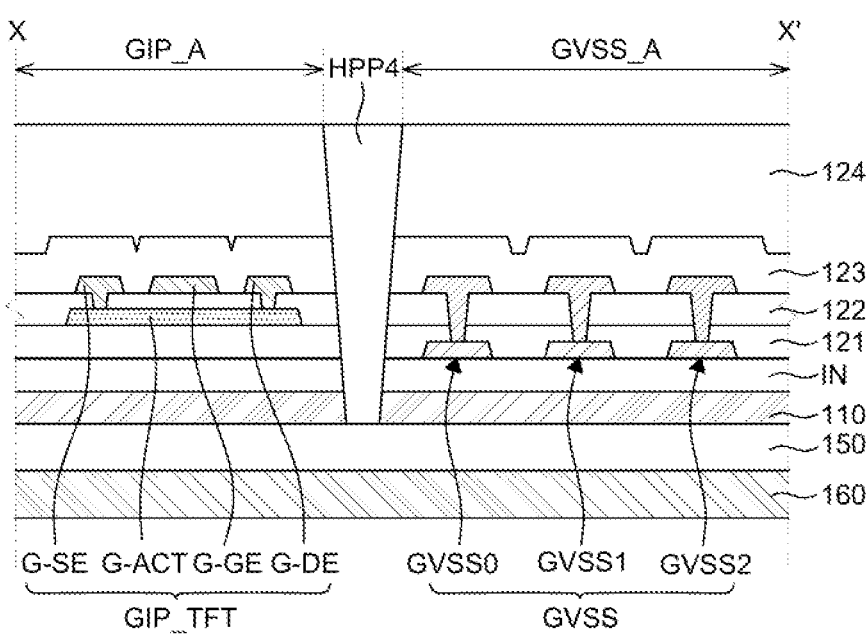
FIGS. 10A to 10D are cross-sectional views of exemplary aspects taken along line X-X' of FIG. 9.

Referring to FIG. 10A, a fourth heat transfer prevention pattern HPP4 is disposed between a GIP driving circuit area GIP_A which configures the GIP driving circuit and a gate low potential voltage line area GVSS_A in which a plurality of gate low potential voltage lines GVSS0, GVSS1, and GVSS2 is disposed. As described above, the fourth heat transfer prevention pattern HPP4 may be formed by removing the substrate 110 and the inorganic insulating layers IN, 121, 122, and 123 disposed between the GIP driving circuit area GIP_A and the gate low potential voltage line area GVSS_A and then filling the organic material. The fourth heat transfer prevention pattern HPP4 may also be formed separately from the overcoating layer 124 or simultaneously formed with the overcoating layer 124 to be integrally formed with the overcoating layer 124 or formed to be filled with air.

Figure 10B:
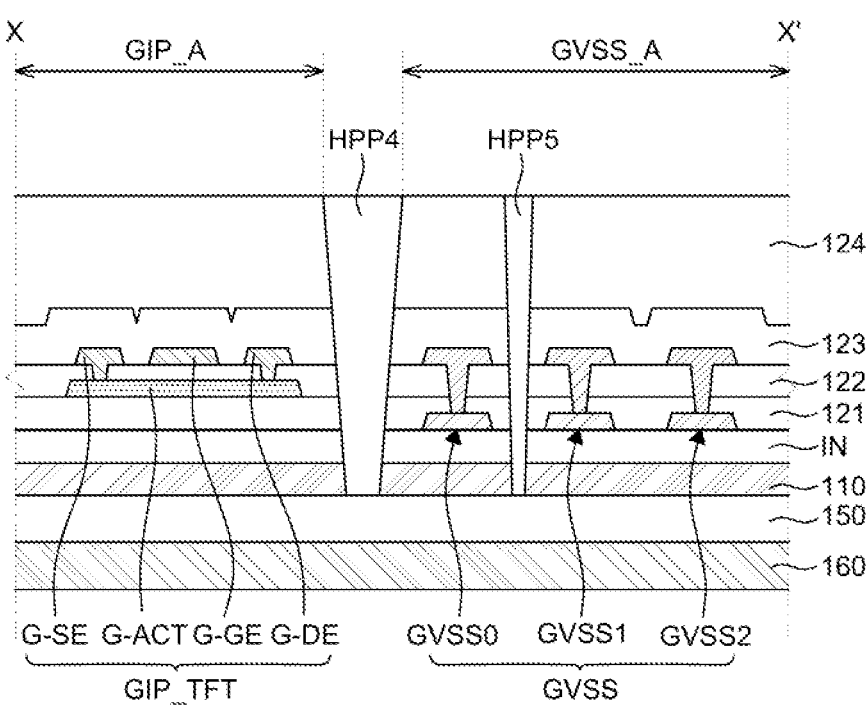

Further, as illustrated in FIG. 10B, the fourth heat transfer prevention pattern HPP4 is disposed between the GIP transistor GIP_TFT which forms the GIP driving circuit and the first gate low potential voltage line GVSS0. A fifth heat transfer prevention pattern HPP5 is disposed between the first gate low potential voltage line GVSS0 and the second gate low potential voltage line GVSS1. The fifth heat transfer prevention pattern HPP5 is also formed by removing the substrate 110 and the inorganic insulating layers IN, 121, 122, and 123 disposed on the first gate low potential voltage line GVSS0 and the second gate low potential voltage line GVSS1 and then filling the organic material. The fifth heat transfer prevention pattern HPP5 may also be formed separately from the overcoating layer 124 or simultaneously formed with the overcoating layer 124 to be integrally formed with the overcoating layer 124 or formed to be filled with air.

Figure 10C:
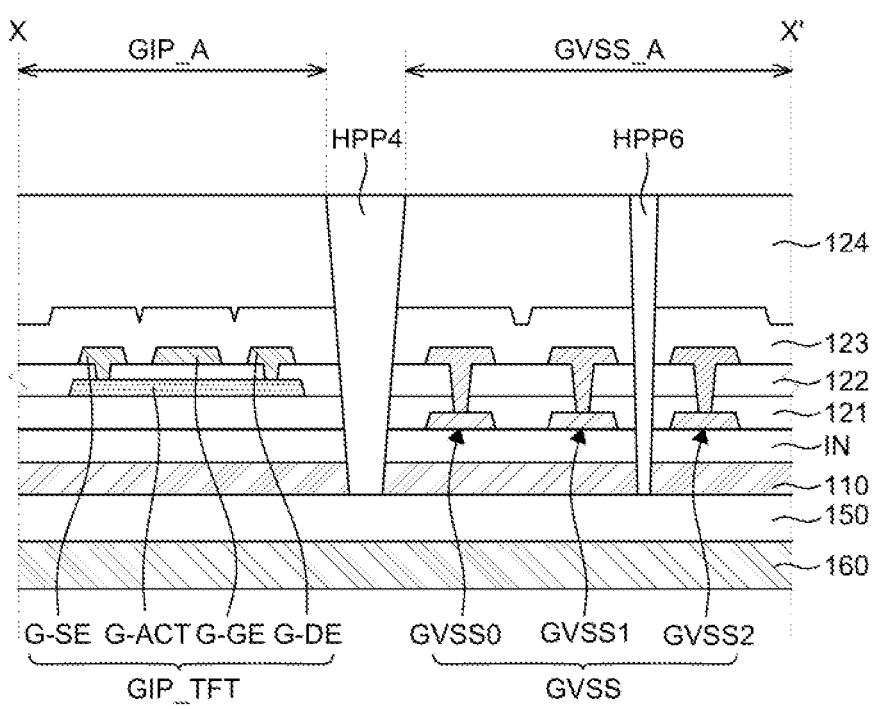

Referring to FIG. 10C, the fourth heat transfer prevention pattern HPP4 is disposed between the GIP transistor GIP_TFT and the first gate low potential voltage line GVSS0. A sixth heat transfer prevention pattern HPP6 is disposed between the second gate low potential voltage line GVSS1 and the third gate low potential voltage line GVSS2. The sixth heat transfer prevention pattern HPP6 is also formed by removing the substrate 110 and the inorganic insulating layers IN, 121, 122, and 123 disposed on the second gate low potential voltage line GVSS1 and the third gate low potential voltage line GVSS2 and then filling the organic material. The sixth heat transfer prevention pattern HPP6 may also be formed separately from the overcoating layer 124 or simultaneously formed with the overcoating layer 124 to be integrally formed with the overcoating layer 124 or formed to be filled with air.

Figure 10D:
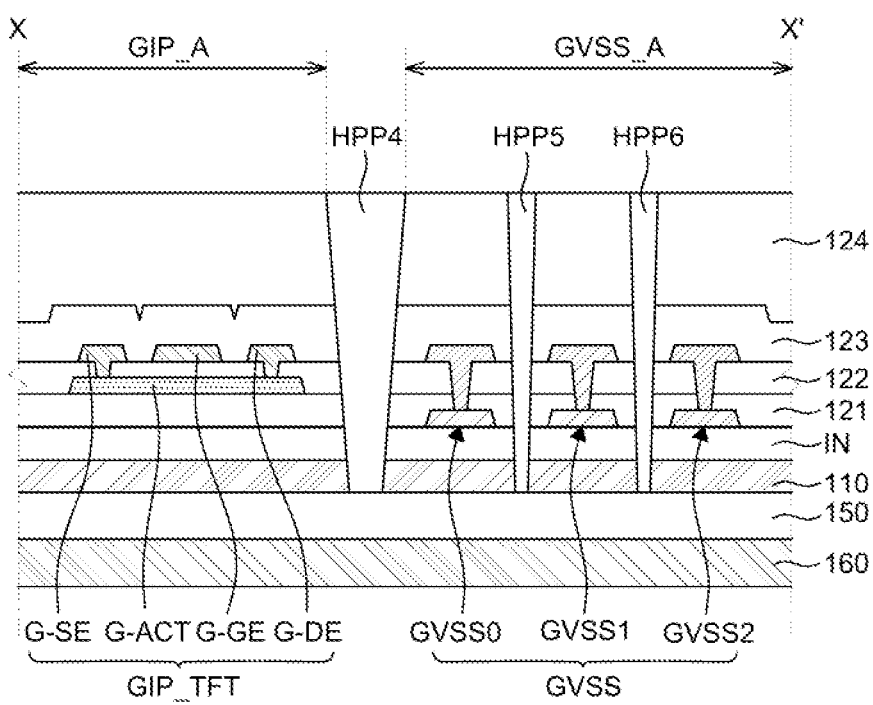

Referring to FIG. 10D, the fourth heat transfer prevention pattern HPP4 is disposed between the GIP transistor GIP_TFT and the first gate low potential voltage line GVSS0. A fifth heat transfer prevention pattern HPP5 is disposed between the first gate low potential voltage line GVSS0 and the second gate low potential voltage line GVSS1. A sixth heat transfer prevention pattern HPP6 is disposed between the second gate low potential voltage line GVSS1 and the third gate low potential voltage line GVSS2. That is, the fourth heat transfer prevention pattern HPP4 is disposed between the GIP driving circuit area GIP_A and an area GVSS_A in which the gate low potential voltage lines GVSS are disposed. The fifth heat transfer prevention pattern HPP5 and the sixth heat transfer prevention pattern HPP6 are also disposed between the gate low potential voltage lines.

As described above, in the display device 100 according to the exemplary aspect of the present disclosure, one or more heat transfer prevention patterns are disposed in an area (B in FIG. 1) which receives the signal applied in the area (A in FIG. 1) to which the signal is applied, as well as the area (A in FIG. 1) to which the signal is applied. By doing this, the device reliability and the driving reliability of the display device 100 may be improved while improving the flexibility of the display device 100.

In the meantime, in the display device 100 according to the exemplary aspect of the present disclosure, the heat transfer prevention pattern may also be disposed in an area in which the ESD circuit ESD is disposed, an area in which the first connection line CL1 is disposed, and an area in which a dummy stage ST (D) of the GIP driving circuit is disposed.

Referring to FIG. 11A, in the non-active area NA, an ESD area ESD_A, a first connection line area CL1_A in which the first connection line CL1 is disposed, and a GIP driving circuit area GIP_A are disposed. In the ESD area ESD_A, an ESD transistor ESD_TFT which configures the EDS circuit and includes a source electrode E-SE, a drain electrode E-DE, a gate electrode E-GE, and an active area E-ACT is disposed. In the GIP driving circuit area GIP_A, a GIP transistor GIP_TFT which forms a dummy stage ST(D) of the GIP driving circuit is disposed. A seventh heat transfer prevention pattern HPP7 is disposed between the ESD area ESD_A in which the ESD transistor ESD_TFT is disposed and the first connection line area CL1_A in which the first connection line CL1 is disposed. The seventh heat transfer prevention pattern HPP7 may be formed by removing the substrate 110 and the inorganic insulating layers IN, 121, 122, and 123 disposed between the ESD area ESD_A and the first connection line area CL1_A and then filling the organic material. The seventh heat transfer prevention pattern HPP7 may also be formed separately from the overcoating layer 124 or simultaneously formed with the overcoating layer 124 to be integrally formed with the overcoating layer 124 or formed to be filled with air. In the meantime, when a plurality of first connection lines CL1 is provided, a heat transfer prevention pattern may be disposed between the plurality of first connection lines CL1.

In the meantime, as illustrated in FIG. 11B, an eighth heat transfer prevention pattern HPP8 is disposed between the first connection line area CL1_A and the GIP driving circuit area GIP_A, among the ESD area ESD_A, the first connection line area CL1_A, and the GIP driving circuit area GIP_A. The eighth heat transfer prevention pattern HPP8 may be formed by removing the substrate 110 and the inorganic insulating layers IN, 121, 122, and 123 disposed between the first connection line area CL1_A and the GIP driving circuit area GIP_A and then filling the organic material. The eighth heat transfer prevention pattern HPP8 may also be formed separately from the overcoating layer 124 or simultaneously formed with the overcoating layer 124 to be integrally formed with the overcoating layer 124 or formed to be filled with air.

Further, as illustrated in FIG. 11C, the seventh heat transfer prevention pattern HPP7 is disposed between the ESD area ESD_A and the first connection line area CL1_A and the eighth heat transfer prevention pattern HPP8 is disposed between the first connection line area CL1_A and the GIP driving circuit area GIP_A.

As described above, in the display device 100 according to the exemplary aspect of the present disclosure, one or more heat transfer prevention patterns are disposed between the ESD area ESD_A in which the ESD circuit ESD is disposed and the first connection line area CL1_A in which the first connection line CL1 is disposed and the GIP driving circuit area GIP_A in which the dummy stage ST (D) of the GIP driving circuit is disposed. By doing this, the damage of the transistor which configures the ESD circuit may be suppressed.

In the meantime, in the display device 100 according to the exemplary aspect of the present disclosure, the heat transfer prevention pattern is also disposed between a plurality of gate link lines GLL.

Referring to FIG. 12, the plurality of gate link lines GLL includes a high potential voltage line VDD, a gate start signal line VST, a first clock signal line CLK1, a second clock signal line CLK2, and a reset signal line RESET.

A ninth heat transfer prevention pattern HPP9 is disposed between the high potential voltage line VDD and the gate start signal line VST and a tenth heat transfer prevention pattern HPP10 is disposed between the gate start signal line VST and the first clock signal line CLK1. An eleventh heat transfer prevention pattern HPP11 is disposed between the first clock signal line CLK1 and the second clock signal line CLK2 and a twelfth heat transfer prevention pattern HPP12 is disposed between the second clock signal line CLK2 and the reset signal line RESET. The ninth to twelfth heat transfer prevention patterns HPP9, HPP10, HPP11, and HPP12 are formed by removing the substrate 110 and the inorganic insulating layers IN, 121, 122, and 123 between the wiring lines and then filling the organic material, as described above. The ninth to twelfth heat transfer prevention patterns HPP9, HPP10, HPP11, and HPP12 are also formed separately from the overcoating layer 124 or simultaneously formed with the overcoating layer 124 to be integrally formed with the overcoating layer 124 or formed to be filled with air.

As described above, in the display device 100 according to the exemplary aspect of the present disclosure, a plurality of heat transfer prevention patterns is disposed between the plurality of gate link lines GLL to suppress the damage of the device due to the heat to improve the reliability of the display device 100.

In the meantime, in the display device 100 according to the exemplary aspect of the present disclosure, the heat transfer prevention pattern is also disposed between a plurality of gate link lines GLL and the GIP driving circuit area GIP_A in which the GIP driving circuit is disposed.

Referring to FIG. 13, a thirteenth heat transfer prevention pattern HPP13 is disposed between a gate link line area GLL_A in which a plurality of gate link lines GLL is disposed and a GIP driving circuit area GIP_A in which the first stage ST(1) is disposed. The thirteenth heat transfer prevention pattern HPP13 may be formed by removing the substrate 110 and the inorganic insulating layers IN, 121, 122, and 123 between the gate link line area GLL_A and the GIP driving circuit area GIP_A and then filling the organic material. The thirteenth heat transfer prevention pattern HPP13 may also be formed separately from the overcoating layer 124 or simultaneously formed with the overcoating layer 124 to be integrally formed with the overcoating layer 124 or formed to be filled with air.

Even though it is not illustrated in FIG. 13, a heat transfer prevention pattern is additionally disposed between the plurality of gate link lines GLL to more efficiently block the heat transfer.

As described above, in the display device 100 according to the exemplary aspect of the present disclosure, the thirteenth heat transfer prevention pattern 13 is disposed between the gate link line area GLL_A and the GIP driving circuit area GIP_A to suppress the damage of the device due to the heat to improve the reliability of the display device 100.

In the meantime, in the display device 100 according to the exemplary aspect of the present disclosure, the heat transfer prevention pattern is also disposed between the plurality of second connection lines CL2 and the GIP driving circuit area GIP_A in which the GIP driving circuit is disposed.

Referring to FIG. 14, a sixteenth heat transfer prevention pattern HPP16 is disposed between a second connection line area CL2_A in which a plurality of second connection lines CL2 is disposed and a GIP driving circuit GIP_A in which a first stage ST(1) of the GIP driving circuit is disposed. further, a fourteenth heat transfer prevention pattern HPP14 and a fifteenth heat transfer prevention pattern HPP15 are also disposed between the plurality of second connection lines CL2. In FIG. 14, it is illustrated that the sixteenth heat transfer prevention pattern HPP16 is disposed between the second connection line area CL2_A and the GIP driving circuit area GIP_A and the fourteenth and fifteenth heat transfer prevention patterns HPP14 and HPP15 are disposed between the plurality of second connection lines CL2. However, the present disclosure is not limited thereto and only one of the fourteenth and fifteenth heat transfer prevention patterns HPP14 and HPP15 is disposed or no heat transfer prevention pattern may be disposed between the plurality of second connection lines CL2. The fourteenth to sixteenth heat transfer prevention pattern HPP14, HPP15, and HPP16 may be formed by removing the substrate 110 and the inorganic insulating layers IN, 121, 122, and 123 between the second connection line area CL2_A and the GIP driving circuit area GIP_A and between the plurality of second connection lines CL2, and then filling the organic material. The fourteenth to sixteenth heat transfer prevention pattern HPP14, HPP15, and HPP16 are also formed separately from the overcoating layer 124 or simultaneously formed with the overcoating layer 124 to be integrally formed with the overcoating layer 124 or formed to be filled with air.

As described above, in the display device 100 according to the exemplary aspect of the present disclosure, the fourteenth to sixteenth heat transfer prevention pattern HPP14 to HPP16 are disposed between second connection line area CL2_A and the GIP driving circuit area GIP_A and the plurality of second connection lines CL2. By doing this, the damage of the device caused by the heat is suppressed to improve the reliability of the display device 100.

The exemplary aspects of the present disclosure may also be described as follows:

According to an aspect of the present disclosure, a display device includes a substrate having an active area including a plurality of sub pixels and a non-active area surrounding the active area; an inorganic insulating layer on the substrate and extending from the active area to the non-active area; a gate in panel (GIP) driving circuit in the non-active area and applying a gate signal to each of the plurality of sub pixels in the active area; a plurality of gate link lines which transmits a gate driving signal transmitted from the outside to the GIP driving circuit; a plurality of low potential voltage lines which transmits a low potential voltage to the GIP driving circuit; and at least one of first heat transfer prevention pattern disposed in an area in which the low potential voltage is applied from the plurality of low potential voltage lines to the GIP driving circuit.

The substrate may be formed of any one of a transparent conducting oxide material and an oxide semiconductor material.

At least one of first heat transfer prevention pattern may be disposed in at least one of an area between the GIP driving circuit and the plurality of low potential voltage lines and an area between the plurality of low potential voltage lines.

At least one of first heat transfer prevention pattern may be disposed in holes of the substrate and the inorganic insulating layer disposed in the area between the GIP driving circuit and the plurality of low potential voltage lines or the area between the plurality of low potential voltage lines. The at least one of first heat transfer prevention pattern may be formed of a material having a thermal conductivity lower than the inorganic insulating layer.

The first heat transfer prevention pattern may be configured by any one of polyimide, urethane, and air.

The display device may further include a second heat transfer prevention pattern disposed in an area between the plurality of gate link lines and the GIP driving circuit.

The display device may further include at least one of third heat transfer prevention pattern disposed in an area between the plurality of gate link lines.

The display device may further include an electro static discharge circuit disposed in the non-active area and configured to discharge overcurrent or static electricity generated in the plurality of gate link lines; a plurality of first connection lines disposed in the non-active area and connecting the plurality of gate link lines and the electro static discharge circuit; and a plurality of second connection lines disposed in the non-active area and connecting the plurality of gate link lines and the GIP driving circuit.

The display device may further include a fourth heat transfer prevention pattern disposed in at least one of an area between the electrostatic discharge circuit and the plurality of first connection lines and an area between the plurality of first connection lines.

The display device may further include a fifth heat transfer prevention pattern disposed between the electrostatic discharge circuit and the GIP driving circuit.

The display device may further include a sixth heat transfer prevention pattern disposed in at least one of an area between the GIP driving circuit and the plurality of second connection lines and an area between the plurality of second connection lines.

The GIP driving circuit may be configured by a plurality of stages, each of the plurality of stages and the plurality of low potential voltage lines may be connected, and the at least one of first heat transfer prevention pattern may be disposed in at least one of an area between the plurality of stages and the plurality of low potential voltage lines and an area between the plurality of low potential voltage lines.

The display device may further include an overcoating layer on the inorganic insulating layer. The first heat transfer prevention pattern may be formed of the same material as the overcoating layer.

In addition, according to another aspect of the present disclosure, a display device includes a substrate having an active area including a plurality of sub pixels and a non-active area surrounding the active area; an inorganic insulating layer on the substrate and extending from the active area to the non-active area; a gate in panel driving circuit in the non-active area and applying a gate signal to each of the plurality of sub pixels in the active area; a plurality of wiring lines which transmits various driving signal to the gate in panel driving circuit; and at least one of heat transfer prevention pattern is disposed in at least one of an area between the gate in panel driving circuit and the plurality of wiring lines and an area between the plurality of wiring lines. Specifically, the wiring lines may generate a heat during the driving, and may include gate link lines, and low potential voltage lines et al., but is not limited thereto.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate having an active area including a plurality of sub pixels and a non-active area surrounding the active area;
an inorganic insulating layer disposed on the substrate and extending from the active area to the non-active area;
a gate in panel (GIP) driving circuit disposed in the non-active area and applying a gate signal to each of the plurality of sub pixels in the active area;
a plurality of gate link lines which transmits a gate driving signal transmitted from the outside to the GIP driving circuit;
a plurality of low potential voltage lines which transmits a low potential voltage to the GIP driving circuit; and
at least one of first heat transfer prevention patterns disposed in an area in which the low potential voltage is applied from the plurality of low potential voltage lines to the GIP driving circuit.

2. The display device according to claim 1, wherein the substrate is formed of one of a transparent conducting oxide material and an oxide semiconductor material.

3. The display device according to claim 1, wherein the at least one of first heat transfer prevention patterns is disposed in at least one of an area between the GIP driving circuit and the plurality of low potential voltage lines and an area between the plurality of low potential voltage lines.

4. The display device according to claim 3, wherein the at least one of first heat transfer prevention patterns is disposed in holes of the substrate and the inorganic insulating layer disposed in the area between the GIP driving circuit and the plurality of low potential voltage lines or the area between the plurality of low potential voltage lines, and
wherein the at least one of first heat transfer prevention patterns is formed of a material having a thermal conductivity lower than the inorganic insulating layer.

5. The display device according to claim 4, wherein the at least one of first heat transfer prevention patterns is configured by one of polyimide, urethane, and air.

6. The display device according to claim 1, further comprising a second heat transfer prevention pattern disposed in an area between the plurality of gate link lines and the GIP driving circuit.

7. The display device according to claim 6, further comprising at least one of third heat transfer prevention patterns disposed in an area between the plurality of gate link lines.

8. The display device according to claim 1, further comprising:
an electrostatic discharge circuit disposed in the non-active area and configured to discharge overcurrent or static electricity generated in the plurality of gate link lines;
a plurality of first connection lines disposed in the non-active area and connecting the plurality of gate link lines and the electrostatic discharge circuit; and
a plurality of second connection lines disposed in the non-active area and connecting the plurality of gate link lines and the GIP driving circuit.

9. The display device according to claim 8, further comprising a fourth heat transfer prevention pattern disposed in at least one of an area between the electrostatic discharge circuit and the plurality of first connection lines and an area between the plurality of first connection lines.

10. The display device according to claim 9, further comprising a fifth heat transfer prevention pattern disposed between the electrostatic discharge circuit and the GIP driving circuit.

11. The display device according to claim 10, further comprising a sixth heat transfer prevention pattern disposed in at least one of an area between the GIP driving circuit and the plurality of second connection lines and an area between the plurality of second connection lines.

12. The display device according to claim 1, wherein the GIP driving circuit is configured by a plurality of stages,
wherein each of the plurality of stages and the plurality of low potential voltage lines are connected, and
wherein the at least one of first heat transfer prevention patterns is disposed in at least one of an area between the plurality of stages and the plurality of low potential voltage lines and an area between the plurality of low potential voltage lines.

13. The display device according to claim 1, further comprising an overcoating layer disposed on the inorganic insulating layer,
wherein the first heat transfer prevention pattern is formed of a same material as the overcoating layer.

14. A display device, comprising:
a substrate having an active area including a plurality of sub pixels and a non-active area surrounding the active area;
an inorganic insulating layer on the substrate and extending from the active area to the non-active area;
a gate in panel driving circuit in the non-active area and applying a gate signal to each of the plurality of sub pixels in the active area;
a plurality of wiring lines which transmits various driving signal to the gate in panel driving circuit; and at least one of heat transfer prevention pattern is disposed in at least one of an area between the gate in panel driving circuit and the plurality of wiring lines and an area between the plurality of wiring lines.

* * * * *